United States Patent [19]
Fujii et al.

[11] Patent Number: 5,280,511
[45] Date of Patent: Jan. 18, 1994

[54] OUTPUT CIRCUIT FOR A CCD WITH CASCODE DEPLETION MOSFET LOADS AND A FEEDBACK CAPACITOR

[75] Inventors: Tatsuhisa Fujii; Iwao Takemoto; Atsushi Hasegawa; Kenji Kitajima; Tetsuro Izawa; Katsumi Matsumoto, all of Mobara, Japan

[73] Assignees: Hitachi, Ltd., Tokyo; Hitachi Device Engineering Co., Ltd., Chiba, both of Japan

[21] Appl. No.: 940,341

[22] Filed: Sep. 3, 1992

[30] Foreign Application Priority Data

Sep. 4, 1991 [JP] Japan .................................. 3-223988
Dec. 24, 1991 [JP] Japan .................................. 3-340595

[51] Int. Cl.⁵ .......................................... H03K 3/353
[52] U.S. Cl. .......................................... 377/60; 377/59; 307/530
[58] Field of Search ..................... 377/60, 59; 307/530

[56] References Cited

U.S. PATENT DOCUMENTS

| | | | |
|---|---|---|---|
| 4,355,244 | 10/1982 | Benoit-Gonin et al. | 377/60 |
| 4,488,129 | 12/1984 | Benoit-Gonin et al. | 307/530 |
| 4,947,376 | 8/1990 | Arimoto et al. | 307/530 |
| 5,220,587 | 6/1993 | Takemoto et al. | 377/60 |

Primary Examiner—William L. Sikes
Assistant Examiner—Scott A. Ouellette
Attorney, Agent, or Firm—Antonelli, Terry, Stout & Kraus

[57] ABSTRACT

Herein disclosed is an amplification circuit for realizing a substantially high sensitivity with a simple structure. The amplification circuit comprises: a first capacitor C1 for receiving a signal charge; a source-follower circuit for receiving a voltage of the first capacitor C1; an inversion amplification circuit including a source-earth type amplification MOSFET Q5 having its gate fed with the output signal of the source-follower circuit through a second capacitor C2; a feedback third capacitor C3 connected between the gate and drain of the amplification MOSFET Q5; and a switch element Q6 for feeding the gate of the amplification MOSFET Q5 with a predetermined bias voltage while the signal charge of the first capacitor C1 is being reset. The amplification MOSFET Q5 has its drain equipped as load means with a depletion type MOSFET Q4 having its gate and source connected, and the depletion type MOSFET Q4 has its source given the same potential as the substrate potential thereof.

3 Claims, 22 Drawing Sheets

φR odd bit output
even bit output

φRA odd bit
output

φRB even bit
output

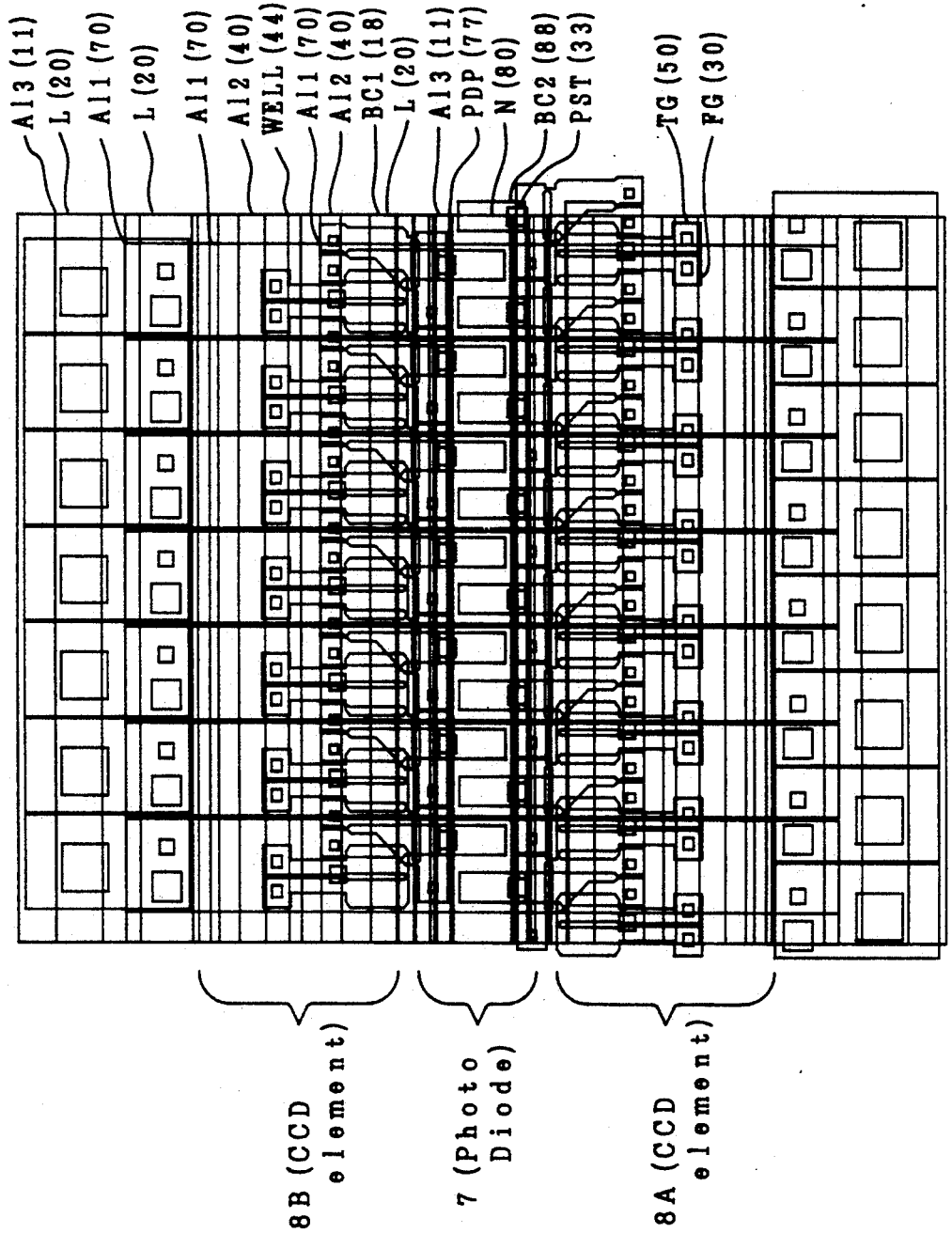

OUTPUT CIRCUIT FOR A CCD WITH CASCODE DEPLETION MOSFET LOADS AND A FEEDBACK CAPACITOR

BACKGROUND OF THE INVENTION

This invention relates to an amplification circuit and, more particularly, to an amplification circuit for a CCD (Charge Coupled Device), for example.

A circuit, as shown in FIG. 22, has been used as the amplification circuit for the CCD. A signal charge is transferred by the CCD to an output diffusion layer (which is expressed structurally equivalently in the form of a diode D), and is converted to the form of a signal voltage by a capacitor C1 which consists of the junction capacity of the output diffusion layer and a parasitic capacity of a reset MOSFET Q1 and a driver MOSFET Q2 of a source-follower circuit.

This signal voltage is outputted through the source-follower circuit which consists of the amplification MOSFET Q2 and a load MOSFET Q3. Such amplification circuit is referred to as an FDA (Floating Diffusion Amplifier). The MOSFET Q1 rests the signal charge retained in the capacitor C1 to a reference voltage VR with a reset pulse $\phi R$ when the signal voltage corresponding to the aforementioned signal charge is amplified and outputted or in other words, before a next signal charge is transferred.

Such FDA is described, for example, on page 64 of "CCD Camera Technique", published on Nov. 3, 1986.

The sensitivity of the aforementioned FDA is given by the product (As/C1) of the capacity value of the capacitor C1 including the parasitic capacity in the reset MOSFET Q1 and in the amplification MOSFET Q2 and the gain (As<1) of the source-follower circuit. The improvement in the gain As is limited by the relation of As<1, and the improvement in the sensitivity of the FDA depends on how much the capacity value of the capacitor C1 can be reduced. In the conventional FDA, therefore, great efforts have been made how to miniaturize the diode D1 and the amplification MOSFET in order to reduce the capacity value of the capacitor C1.

If the size of the amplification MOSFET Q2 is reduced, however, the output current essentially becomes smaller, and there occurs a contradictory problem that the load driving capacity of a post stage circuit is lost. Thus, it has been customary to cascade a plurality of source-follower circuits so as to make up for insufficiency of the driving capacity of the initial stage circuit.

SUMMARY OF THE INVENTION

In FDA available at present, the capacity value of the capacitor C1 described above has come to below $10^{-14}$F, and the voltage sensitivity has exceeded 10 microvolts per electron. From the aspect of application, however, the number of electrons handled per signal is at most some dozens, and a further increase of the output signal amplitude has been desired. The real sensitivity is determined by an S/N (signal-to-noise ratio), and in order to improve this S/N, reduction of thermal noise that occurs at random is particularly indispensable.

The thermal noise occurring in the CCD itself has been reduced remarkably by a variety of devices, and the thermal noise in a CCD imaging device is determined by the thermal noise generated in the FDA. The principal components of the noise in the FDA are the reset noise of the capacitor C1 and the 1/f noise of the amplification MOSFET Q2.

The former reset noise is proportional to the square of the capacitor C1 and decreases with the reduction of its size. On the contrary, the latter 1/f noise is substantially in inverse proportion to the reduction of the size.

Since such random noise is contained in both of the dark output (reset voltage) and the bright output (signal charge output), it can be offset by obtaining the difference by a correlational double sampling (CDS) circuit to generate a signal. However, there is a limit to the noise reduction by the CDS circuit because there exist the distortion of waveforms up to the CDS circuit, the disturbances of the waveforms due to various jump-in pulses resulting from the extension of wirings, and so on.

It is, therefore, an object of the present invention to provide an amplification circuit which can accomplish a substantially high sensitivity with a simple circuit structure.

It is another object of the present invention to provide a highly sensitive amplification circuit which will be suitable for a CCD.

In order to achieve these objects, according to a basic feature of the present invention, there is provided an amplification circuit which comprises: a first capacitor for receiving a signal charge; a source-follower circuit for receiving a voltage of said first capacitor; an inversion amplification circuit including a source-earth type amplification MOSFET having its gate fed with the output signal of said source-follower circuit through a second capacitor; a feedback third capacitor connected between the gate and drain of said amplification MOSFET; and a switch element for feeding the gate of said amplification MOSFET with a predetermined bias voltage while the signal charge of said first capacitor is being reset, wherein said amplification MOSFET has its drain equipped as load means with a depletion type MOSFET having its gate and source connected, and wherein said depletion type MOSFET has its source given the same potential as the substrate potential thereof.

According the means described above, only the signal component can be transmitted at first by the second capacitor to generate an amplified output signal of excellent linearity by the inversion amplification circuit in a manner to correspond to the second capacitor and the third capacitor. At the same time, the amplification MOSFET can be biased to its optimum operation point by the switch element during the reset period of the first capacitor.

Since, moreover, the depletion type MOSFET disposed as the load means at the drain of the aforementioned amplification MOSFET has its source given the same potential as the substrate potential, its drain conductance can be reduced to improve the constant current characteristics thereby to have its open gain and feedback gain raised.

Thus, it is possible to provide an amplification circuit which can realize a substantially high sensitivity with a simple circuit structure.

These and other objects and many of the attendant advantages of this invention will be readily appreciated as the same becomes better understood by reference to the following detailed description when considered in connection with the accompanying drawings.

BRIEF DESCRIPTION OF THE DRAWINGS

FIG. 13 is a top plan view showing a relation between a wiring layer to be connected with a charge transfer electrode of a CCD element in a line sensor, to which the present invention is applied, and a conductive layer to be formed over the wiring layer;

DESCRIPTION OF THE PREFERRED EMBODIMENTS

One embodiment of a line sensor, to which an amplification circuit according to the present invention is applied, will be described with reference to the accompanying drawings.

Overall Schematic Description

Figure 5:
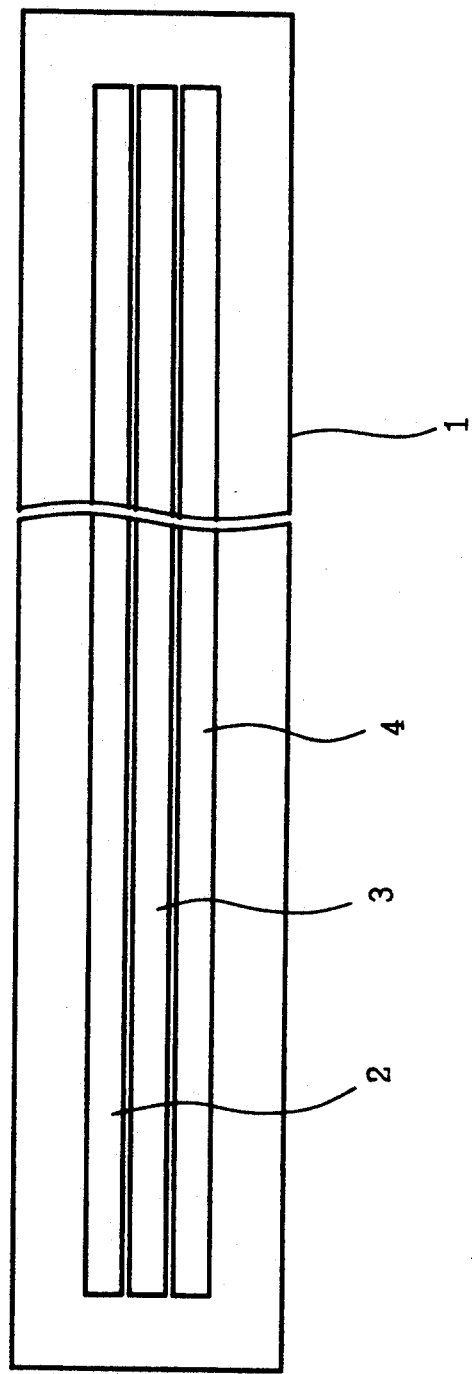
FIG. 5 is a top plan view showing the appearance of one embodiment of a semiconductor device, to which an amplification circuit according to the present invention is applied.
Figure 6:
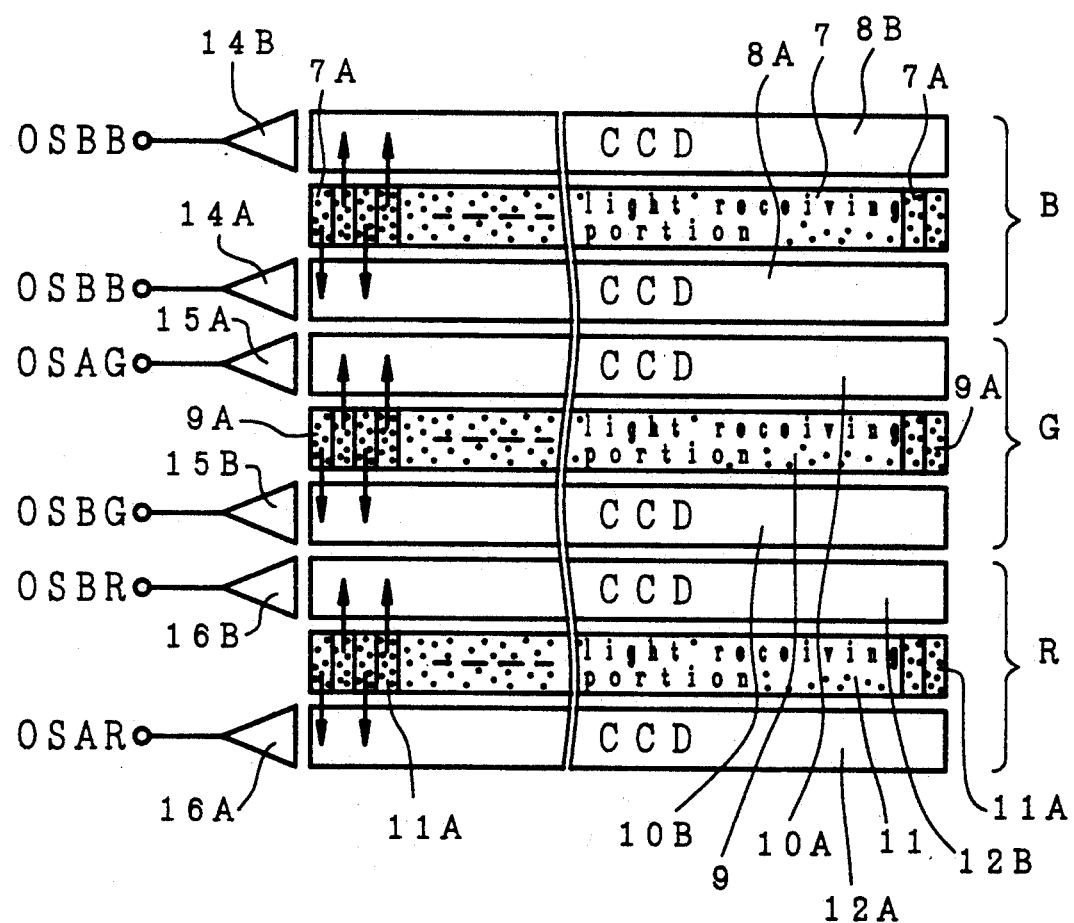
FIG. 6 is a top plan view showing individual elements to be packaged in a line sensor or one embodiment of a semiconductor device, to which an amplification circuit according to the present invention is applied.

FIG. 5 is a top plan view showing a semiconductor chip 1 constituting a color line sensor and sized to have a length of 51.3 mm and a width of 1.82 mm, for example. The semiconductor chip is formed with three longitudinally extending stripe filters which are transversely juxtaposed to one another, such as a blue filter 2, a green filter 3 and a red filter 4 arranged sequentially from the top. Below the blue filter 2, the green filter 3 and the red filter 4, as shown in FIG. 6, there are respectively formed: a light receiving portion 7, on which a blue light having passed through the blue filter 2 is incident, and CCD elements 8A and 8B for transferring the charge generated in the light receiving portion 7; a light receiving portion 9, on which a green light having passed through the green filter 3 is incident, and CCD elements 10A and 10B for transferring the charge generated in the light receiving portion 9; and a light receiving portion 11, on which a red light having passed through the red filter 4 is incident, and CCD elements 12A and 12B for transferring the charge generated in the light receiving portion 11.

The individual light receiving portions 7, 9 and 11 are individually formed with a plurality of shielding photo diodes 7A, 9A and 11A of metal films which are juxtaposed to one another. Moreover, the photo diode 7A positioned at the most lefthand side of the Figure, for example, has its charge read out by the CCD element 8A, and the adjacent next photo diode 7A has its charge read out by the CCD element 8B.

Thus, the photo diode 7A positioned in an odd number has its charge read out by the CCD element 8A whereas the photo diode 7A positioned in an even number has its charge read out by the CCD element 8B. This relation is similar to that between the light receiving portion 9 and the CCD elements 10A and 10B and that between the light receiving portion 11 and the CCD elements 12A and 12B. This is because the charge transfer rate is to be accelerated and because the structure of the CCD transfer passage per photo diode is enlarged to afford a process working allowance.

Moreover, the charges transferred by the individual CCD elements 8A, 8B, 10A, 10B, 12A and 12B are inputted to output detectors 14A, 14B, 15A, 15B, 16A and 16B which are formed at one side of the individual CCD elements in the same direction, so that they are converted into voltage signals, for example.

Figure 7:
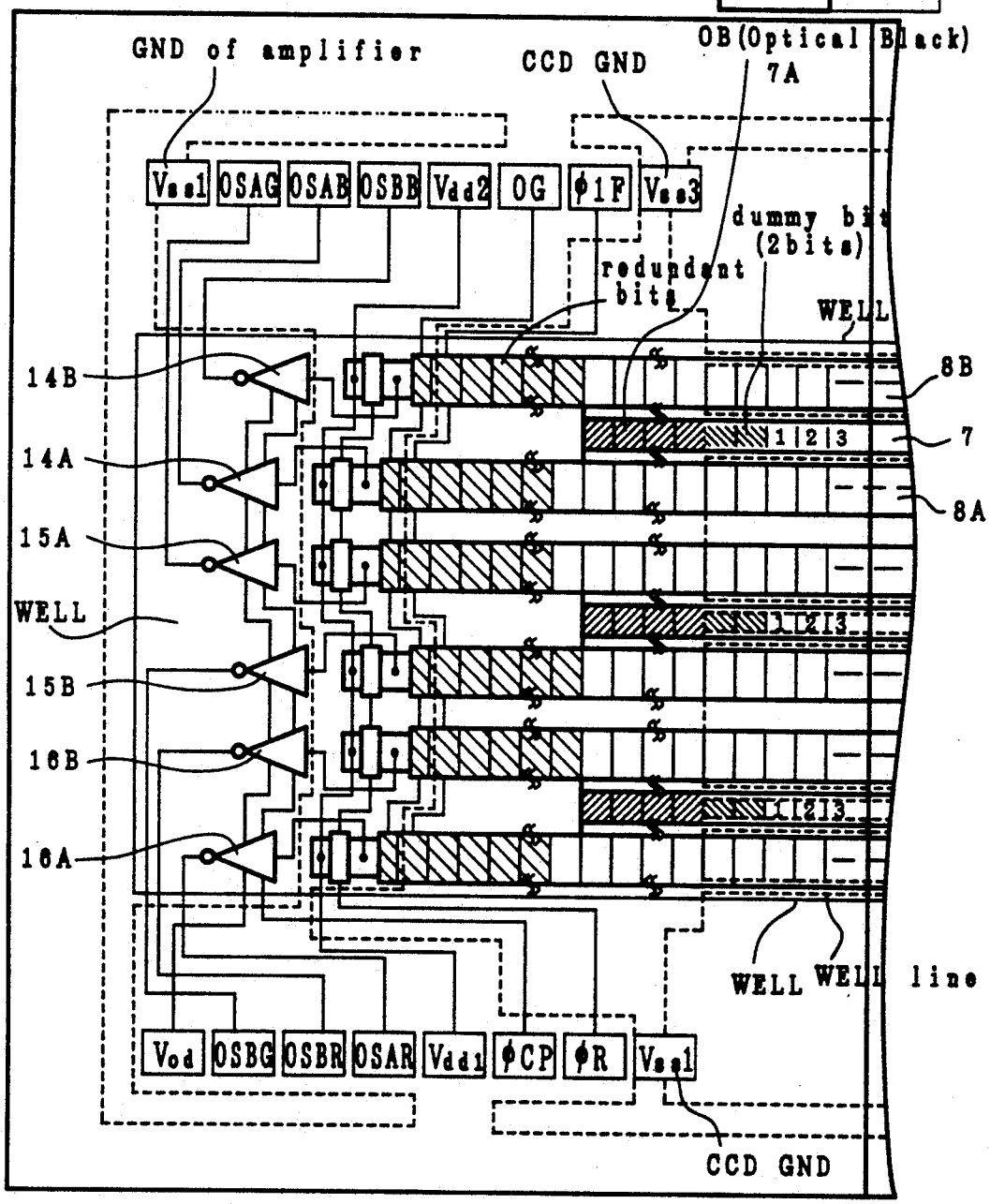
FIG. 7 is a top plan view showing a structure of one embodiment of a line sensor, to which an amplification circuit according to the present invention is applied, and is completed by FIG. 8.
Figure 8:
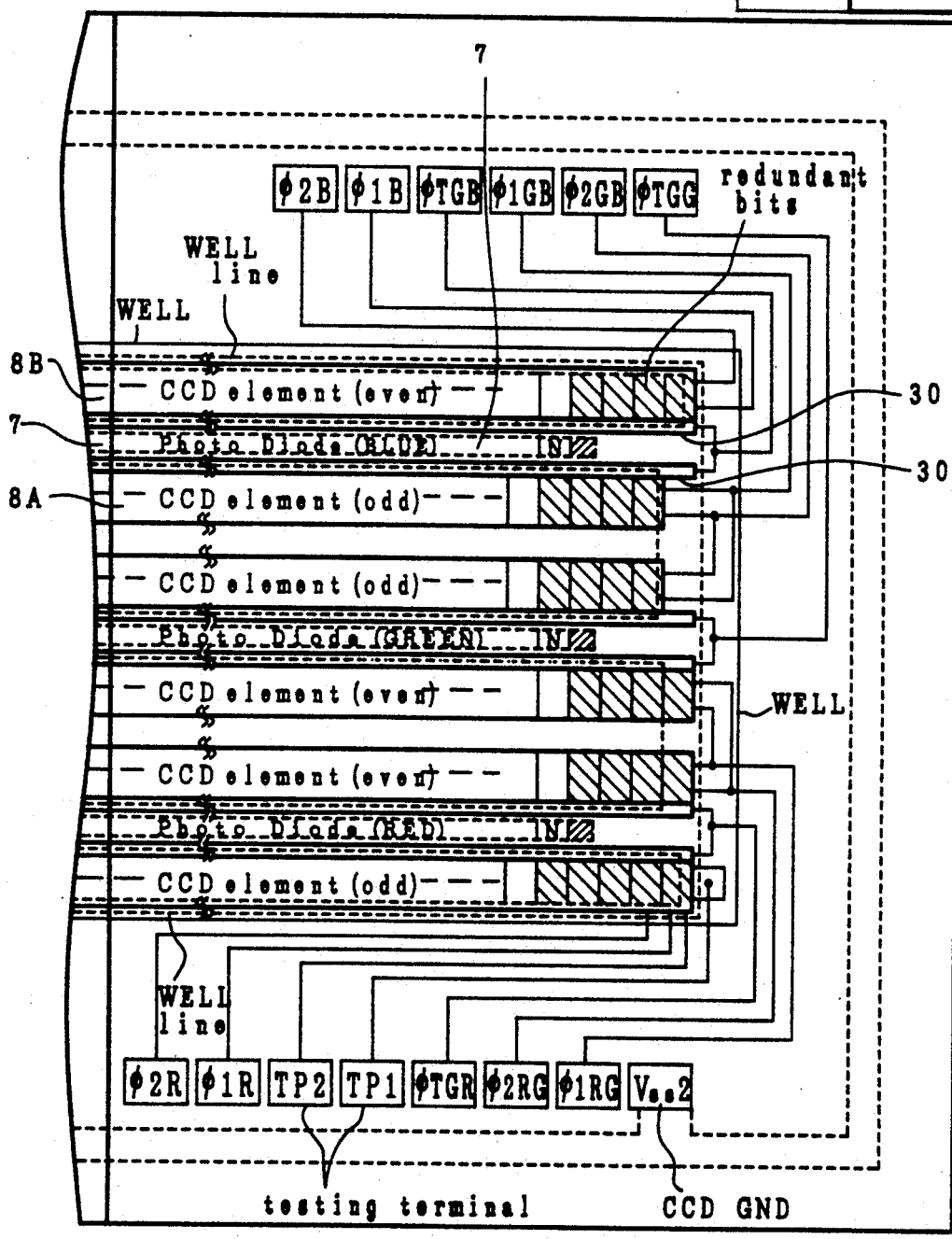
FIG. 8 is a top plan view showing a structure of one embodiment of a line sensor, to which the present invention is applied, and is completed by FIG. 7.

FIGS. 7 and 8 are schematic structure diagrams showing the principal surface of a semiconductor device which is packaged with a line sensor. Incidentally, FIGS. 7 and 8 constitutes one drawing together. In each of the same Figures, a one-chip semiconductor substrate has its principal surface formed with individual elements in the shown array.

Since the photo diodes, the CCD elements and the output detectors in charge of the blue, green and red colors individually have the similar structures, here will be described the photo diode 7, the CCD element 8A and 8B and the output detectors 14A and 14B taking charge of the blue color.

Photo Diodes

As shown in FIGS. 7 and 8, there are juxtaposed in one direction the photo diodes 7, of which a plurality of so-called "OB (Optical Black)" 7A prevented from having the function of a photo diode by a later-described shielding film are disposed at the side of the output detector whereas two photo diodes at the OB side or one photo diode at the opposite end is disposed such that it is exposed from the aforementioned shielding film but used as a dummy. Thus, the individual charges to be photoelectrically generated by an N number of intervening photo diodes 1, 2, 3, - - -, and N are used as detection signals. Incidentally, the amounts of the aforementioned charges are proportional to the intensities of irradiating lights.

Figure 9A:
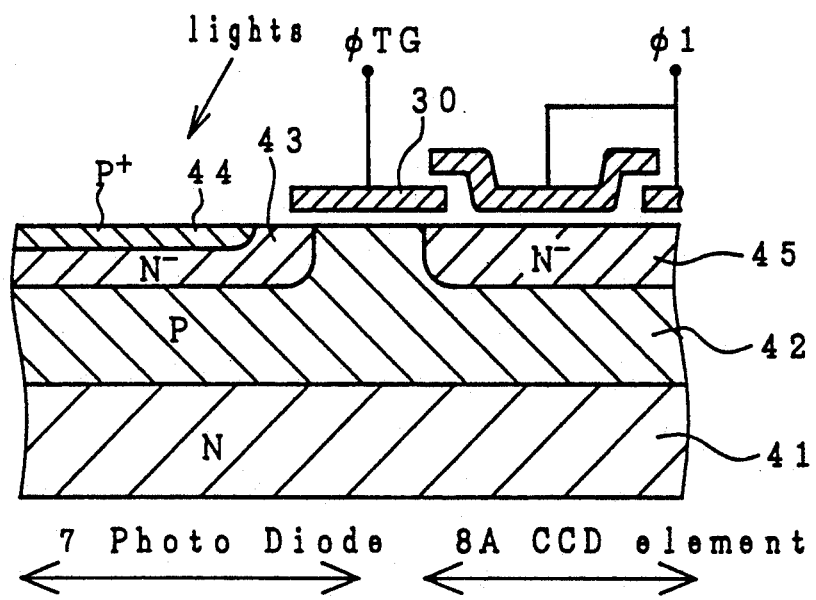
FIGS. 9(a) and 9(b) are diagrams for explaining a charge reading operation of a CCD element from a photo diode of a line sensor, to which the present invention is applied.

Moreover, the photo diode is constructed, as shown in FIG. 9(a), by forming a lightly doped N-type diffusion layer 43 over the principal surface of a P-well layer 42 over the surface of an N-type semiconductor substrate 41, so that a charge is stored in the junction between the P-well layer 42 and the N-type diffusion layer 43. In the same Figure, the N-type diffusion layer 43 has its principal surface formed with a heavily doped P-type diffusion layer 44, which acts as a diffusion layer for preventing the so-called "dark current".

Charge Reading Portion of Photo Diode

In FIGS. 7 and 8, the individual CCD elements 8A and 8B positioned at the upper and lower side portions of each of the juxtaposed photo diodes 7 are arranged therebetween with gate electrodes 30, which are fed with a gate voltage through a terminal $\phi$TGB. This gate electrode 30 is an electrode for reading out the charge of the photo diode 7 to the CCD element and has a section, as shown in FIG. 9(a). In FIG. 9(a), the gate electrode 30 is arranged through a not-shown gate oxide film between the N-type diffusion layer 43 forming part of the photo diode 7 and a charge transfer passage (of N-type diffusion layer) 45 forming part of the CCD element 8A.

Figure 9B:
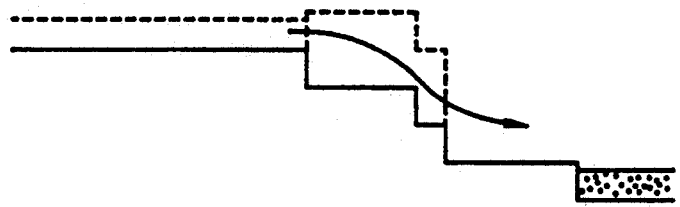

If the gate electrode 30 is fed with the gate electrode, the potential distribution changes from a dotted curve to a solid curve, as shown in FIG. 9(b), so that the charge transfers to the CCD element 8A (i.e., the charge transfer passage 45).

CCD Element Portion

Before entering into the description of the CCD elements 8A and 8B shown in FIGS. 7 and 8, the relations between transfer electrodes in the CCD elements 8A and 8B and voltages to be applied to the transfer electrodes will be described with reference to FIGS. 10(a) and 10(b). Since the CCD elements 8A and 8B have similar constructions, the description to be made will be limited to the CCD element 8A.

Figure 10A:
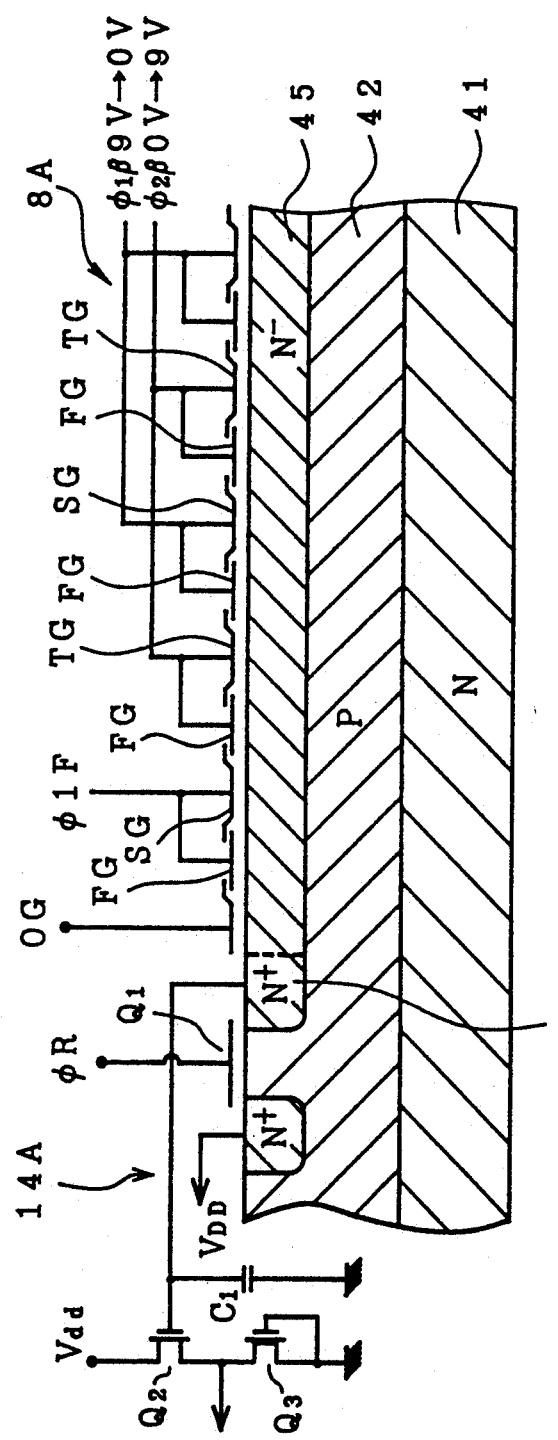
FIGS. 10(a) and 10(b) are diagrams for explaining a charge transfer of a CCD element in a line sensor, to which the present invention is applied.

FIG. 10(a) is a section taken in the charge transfer direction. Over the N-type diffusion layer 45 acting as the charge transfer passage, the transfer electrodes are juxtaposed along the N-type diffusion layer 45 through a not-shown gate oxide film. Each transfer electrode is formed of a first-layered transfer electrode FG and a second-layered transfer electrode SG, which has its two end portions overlapping the firsts-layered transfer electrode FG.

Of the individual transfer electrodes thus juxtaposed, the first-layered transfer electrode FG adjacent to an output gate electrode OG and the next second-layered transfer electrode adjacent to the former are commonly connected with each other so that they are fed with a voltage $\phi 1$ from a terminal $\phi 1$B shown in FIG. 8. Moreover, the next adjacent first-layered transfer electrode FG and the next adjacent second-layered transfer electrode are commonly connected with each other so that they are fed with a voltage $\phi 2$ from a terminal $\phi 2$B shown in FIG. 8. Still moreover, the adjacent first-layered transfer electrode FG and the next adjacent second-layered transfer electrode are commonly connected so that they are fed with the voltage $\phi 1$ from the terminal $\phi 1$B shown in FIG. 8. Furthermore, the next adjacent first-layered transfer electrode FG and the next adjacent second-layered transfer electrode are commonly connected with each other so that they are fed with a voltage $\phi 2$ from a terminal $\phi 2$B shown in FIG. 8.

In this structure, the terminal $\phi 1$B is fed with a pulse voltage varying from 9 V to 0 V and from 0 V to 9 V, for example. Simultaneously with this, the terminal $\phi 2$B is fed with a pulse voltage varying from 0 V to 9 V and from 9 V to 0 V.

Figure 10B:
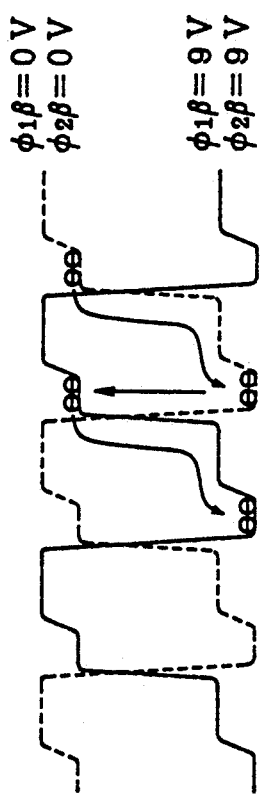

Thus, in case the terminal $\phi 1$B is fed with 9 V whereas the terminal $\phi 2$B is fed with 0 V, the potential distribution, as shown by the solid curve of FIG. 10(b), is established in the charge transfer passage (i.e., N-type diffusion layer). In case, on the other hand the terminal $\phi 1$B is fed with 0 V whereas the terminal $\phi 2$B is fed with 9 V, the potential distribution changes to such one as is shown by the dotted curved of FIG. 10(b). In this case, it will be understood that the charge migrates to the side of the output detector 14A sequentially in accordance with the change in the potential distribution.

This output detector 14A will be described in more detail hereinafter. In FIG. 10(a), the charge transferred by applying the voltage to the output gate electrode OG is converted by the capacitor C1 or the parasitic capacity of the reset MOSFET Q1 and the amplification MOSFET Q2 to a voltage value, which is applied to the gate electrode of the MOSFET Q2. As a result, the displacement voltage of said MOSFET Q2 is fed out as an output.

Incidentally, the reason why the charge to be transferred to an output diffusion layer 50 by the voltage application to the output gate electrode OG is outputted to a power source VDD by applying the reset pulse $\phi$R to the reset MOSFET Q1, as shown in FIG. 10(a), is for sweeping out the stored charge to the output diffusion layer 50.

In FIGS. 7 and 8, the CCD elements 8A and 8B, which are formed respectively at the upper and lower sides of each of the juxtaposed photo diodes 7, are arranged in this embodiment such that one is displaced to an extent of the commonly connected transfer electrode with respect to the other.

Specifically, the transfer step number at the unit of bits to be consumed till the first photo diode 7 (as indicated at 1 in the Figures) excepting those for the OB or dummy is transferred to the CCD element 8A for the odd numbers and reaches the detector 14A is equalized to that at the unit of bits to be consumed till the second photo diode 7 (as indicated at 2 in the Figures) is transferred to the CCD element 8B for the even numbers and reaches the output detector 14B.

Likewise, the transfer step number at the unit of bits to be consumed till the third photo diode 7 (as indicated at 3 in the Figures) is transferred to the CCD element 8A for the odd numbers and reaches the detector 14A is equalized to that at the unit of bits to be consumed till the fourth photo diode 7 (as indicated at 4 in the Figures) is transferred to the CCD element 8B for the even numbers and reaches the output detector 14B.

The present embodiment thus constructed has the following technical effects because the transfer step number from the location of the aforementioned CCD element having read out the charge from an n-th photo diode to the output detector is equalized to the transfer step number from the location of the aforementioned CCD element having read out the charge from an (n+1)-th photo diode to the output detector.

Figure 11A:
FIGS. 11(a) and 11(b) are time charts for explaining an output signal according to one embodiment of an output detecting circuit in a line sensor, to which the present invention is applied.
Figure 11B:
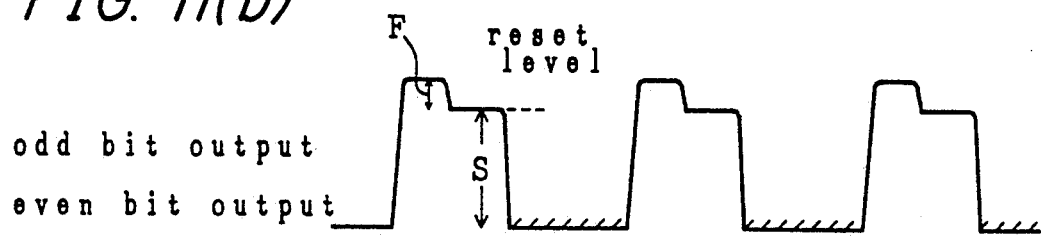
Figure 12A:
FIGS. 12(a) to 12(d) are time charts for explaining output signals according to another embodiment of an output detecting circuit in a line sensor, to which the present invention is applied.
Figure 12B:
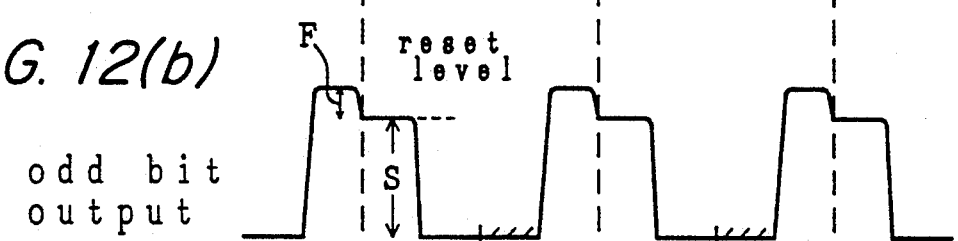
Figure 12C:
Figure 12D:
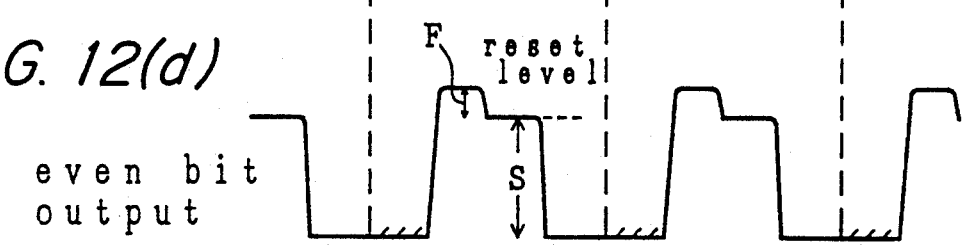

Thus, as shown in FIG. 11, the application of the reset pulse $\phi R$ to the CCD elements 8A and 8B can be applied at the same timing (as shown in FIG. 11(a)), and the outputs of the individual output detectors 14A and 14B can be detected in the same phase (as shown in FIG. 11(b)).

Incidentally, the output signal shown in FIG. 11(b) is composed, with reference of the reset level, of a feed through component F by the reset pulse $\phi R$ and a signal component S to be subsequently outputted.

In this case, no influence is exerted by the aforementioned reset pulse $\phi R$ during a period in which the outputs of the signal components S from the individual CCD elements 8A and 8B are detected after the application of the reset pulse $\phi R$. As a result, the signal extraction active period (as hatched in the Figure) freed from the influence of noise can be drastically elongated, as compared with that of the prior art.

In this case, the timings of the outputs from the individual output detectors 14A and 14B are different from those of the prior art, but there arises no serious problem because the image processing is accomplished outside of the semiconductor chip through the FIFO line memory.

Incidentally, the present embodiment should not be limited to such structure but can naturally be modified by making different the timings of the individual reset pulses at the CCD elements 8A and 8B, as shown in FIG. 12. As shown in the same Figure, a reset pulse $\phi RA$ (of FIG. 12(a)) and a reset pulse $\phi RB$ (of FIG. 12(c)) have different timings of application such that the odd bit output (of FIG. 11(b)) is outputted as the reset pulse $\phi RA$ is applied whereas the even bit output (of FIG. 11(d)) is outputted as the reset pulse $\phi RB$ is applied.

In FIGS. 7 and 8, moreover, both the CCD elements 8A and 8B are made longer at their two ends than the photo diodes 7 for the OB and the dummy, thus constituting the so-called "redundant bits".

Shielding Film over CCD Element Portion

In this embodiment, special devices have been made on the shielding films over the individual CCD elements 8A, 8B, 10A, 10B, 12A and 12B.

Figure 14:
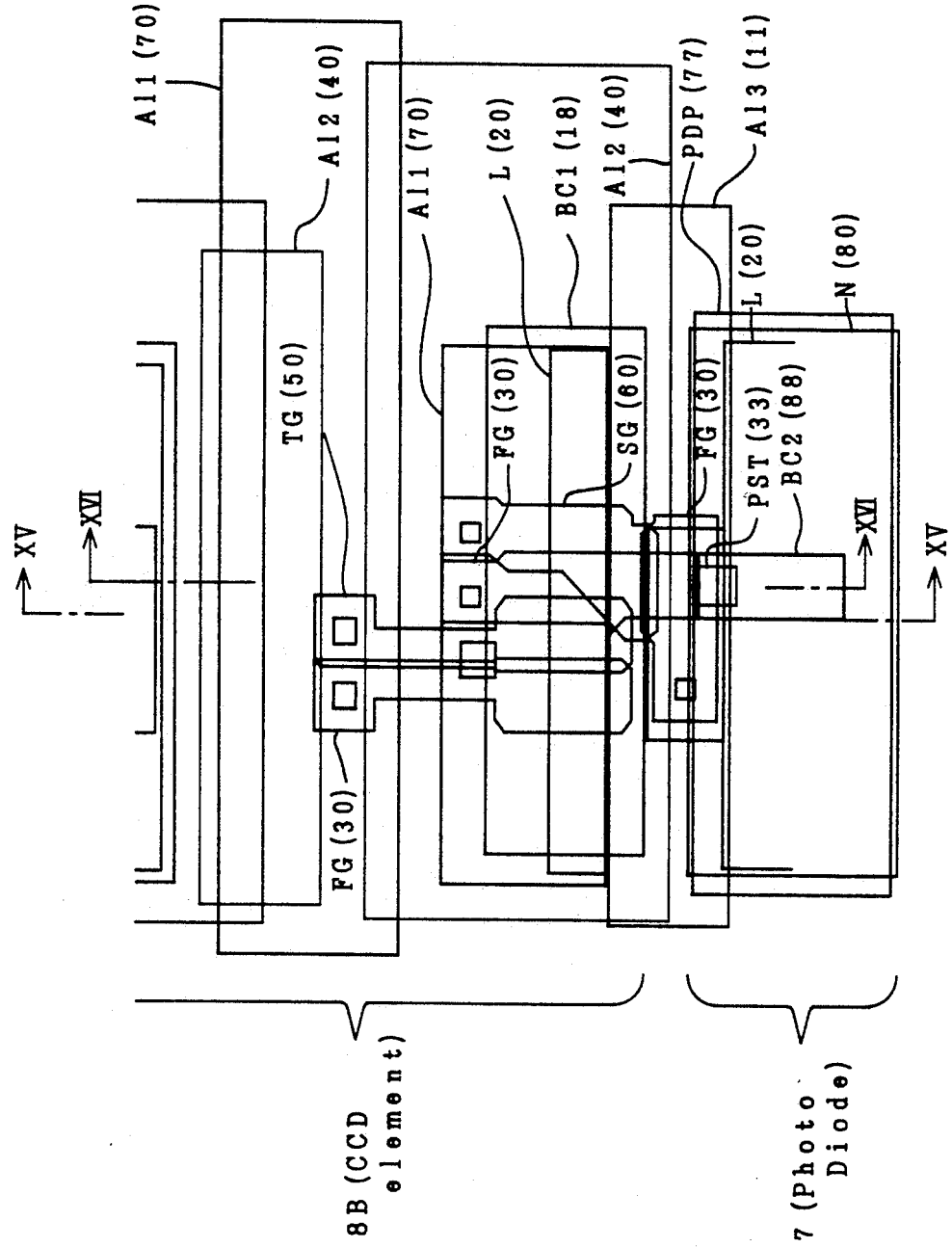
FIG. 14 is a top plan view showing a portion of FIG. 13 in an enlarged scale.

FIG. 13 is a top plan view showing the photo diode 7 and the electrode pattern in the area which is formed with the CCD elements 8A and 8B positioned at the upper and lower sides of the photo diode 7. On the other hand, FIG. 14 is a top plan view showing a portion of FIG. 13 in an enlarged scale. In FIG. 14, there are found an N-type diffusion layer N (80) forming the photo diode and an N-type diffusion layer BC1 (18) adjacent to that N-type diffusion layer N (80) and forming the CCD element to provide the charge transfer passage.

The charge, which is generated at the junction between the aforementioned N-type diffusion layer N (80) and a first-layered P-type well layer formed with the N-type diffusion layer N (80), is transferred by the first-layered gate electrode FG (30) acting as the read gate and the second-layered gate electrode SG (60) to the N-type diffusion layer BC1 (18) acting as the aforementioned charge transfer passage and is then transferred to the not-shown output detecting circuit by the gate electrodes which are juxtaposed along the charge transfer passage.

Here, as in the aforementioned connection diagram shown in FIG. 10, a first-layered aluminum wiring layer A11 (70) for connecting the aforementioned second-layered gate electrode SG (60) and the adjacent first-layered gate electrode FG (30) commonly is positioned and arranged in parallel with the aforementioned charge transfer passage.

Moreover, another first-layered aluminum wiring layer A11 (70) for connecting the adjacent third-layered gate electrode TG (50) and the first-layered gate electrode FG (30) adjacent to the former gate electrode TG (50) commonly is positioned and arranged in parallel with the aforementioned aluminum wiring layer A11 (70).

Still moreover, a second-layered aluminum wiring layer A12 (40) is formed to cover the gaps between the aforementioned individual aluminum wiring layers A11 (70) and is connected through not-shown contacts with those of the aluminum wiring layers A11 (70), which are connected with the gate electrodes SG (60) and FG (30), and TG (50) and FG (30).

Figure 15:
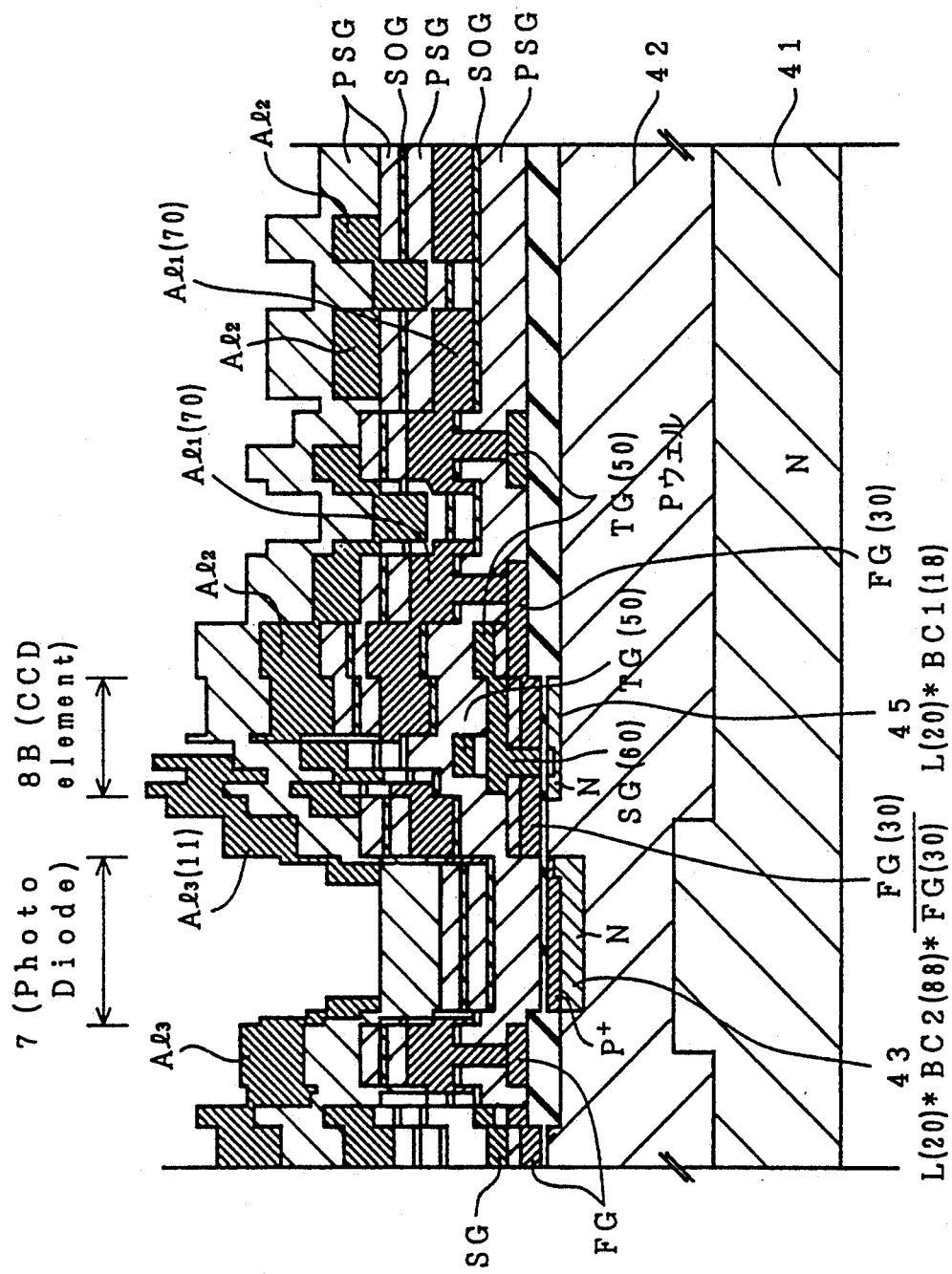
FIG. 15 is a section taken along line XV—XV of FIG. 14.
Figure 16:
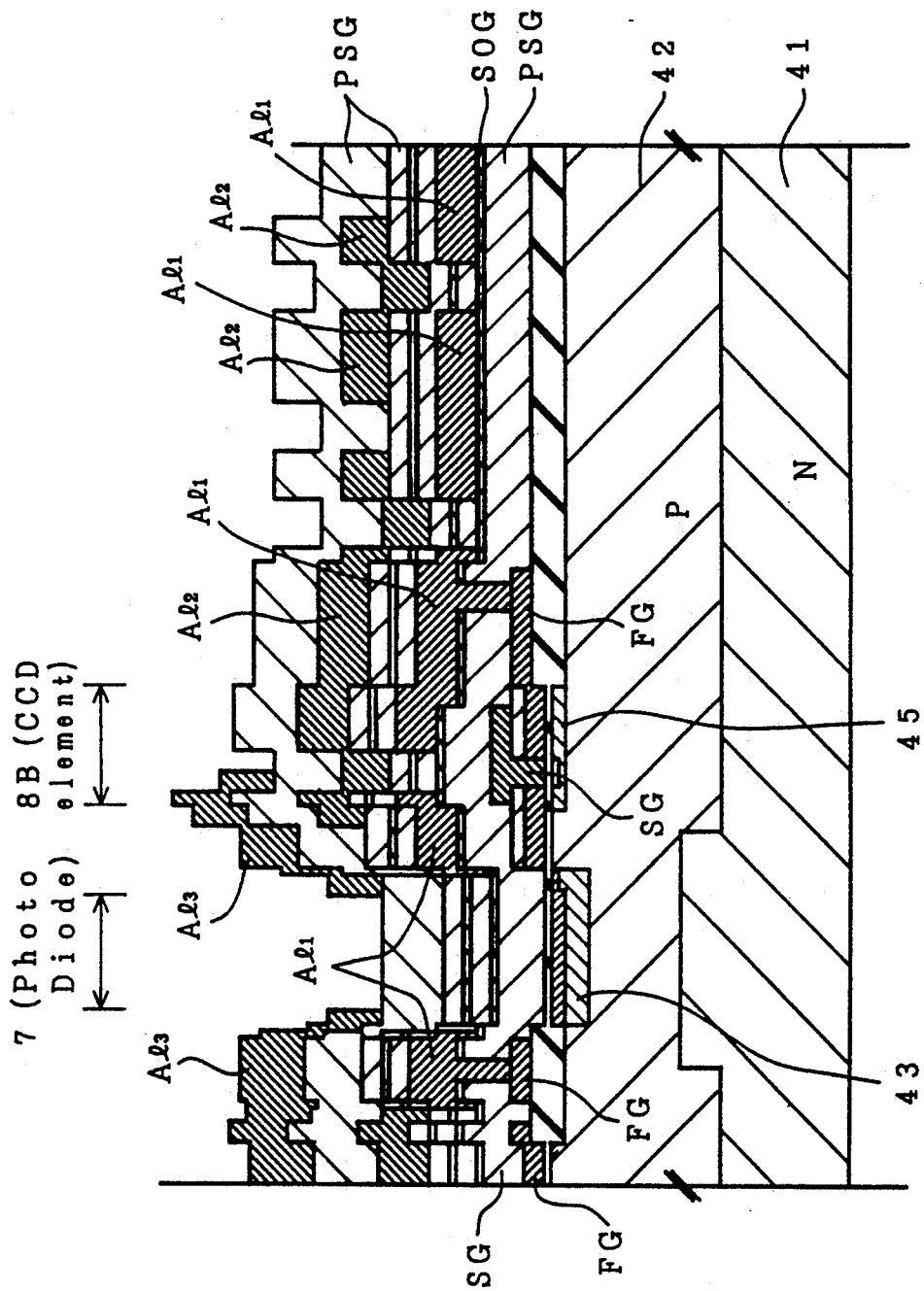
FIG. 16 is a section taken along line XVI—XVI of FIG. 14.

Incidentally, a section of FIG. 14 taken along line XV—XV is shown in FIG. 15, and a section taken along line XVI—XVI is shown in FIG. 16.

In either of FIG. 7 or 8, the area forming the N-type diffusion layer 43 constitutes the photo diode together with the P-type well layer. This structure is formed thereover with transparent laminated films of SOG or PSG, the uppermost one of which is formed around its periphery with a shielding film acting as a third-layered aluminum film A13.

Apart from this area forming the photo diode 7, moreover, there is formed over the area forming the CCD element 8B and over the distant area the first-layered aluminum wiring layer A11 which is connected with the charge transfer electrode FG, SG or TG of the CCD element. The first-layered aluminum wiring layers A11 of this case are different between one connected with the charge transfer electrode FG and one connected with the charge transfer electrode TG and are extended at a spacing from the surface to the back of the sheet of the drawing.

Moreover, the second-layered aluminum wiring layer A12 is formed to cover at least the separating areas of the individual aluminum wiring layers A11 and is electrically connected through the not-shown contact with one of the aluminum wiring layers A11 separated from each other.

The structure thus made has the following technical effects.

In the embodiment thus far described, specifically, the second-layered aluminum wiring layer A12 is formed to cover at least the area between the first-layered aluminum wiring layer A11 connecting the individual charge transfer electrodes, and these first-layered aluminum wiring layers A11 and second-layered aluminum wiring layer A12 are electrically connected through holes, for example, so that they constitute the shielding film.

Thus, the wiring layers and the shielding film are refrained from having their individual functions, as is different from the prior art. This prevents the wiring layers arranged over the earthed shielding film from being additionally given an anti-ground capacity. As a result, a high speed drive can be achieved in a clock signal which is inputted through the aforementioned wiring layers.

Circuit of Output Detector

Figure 1:
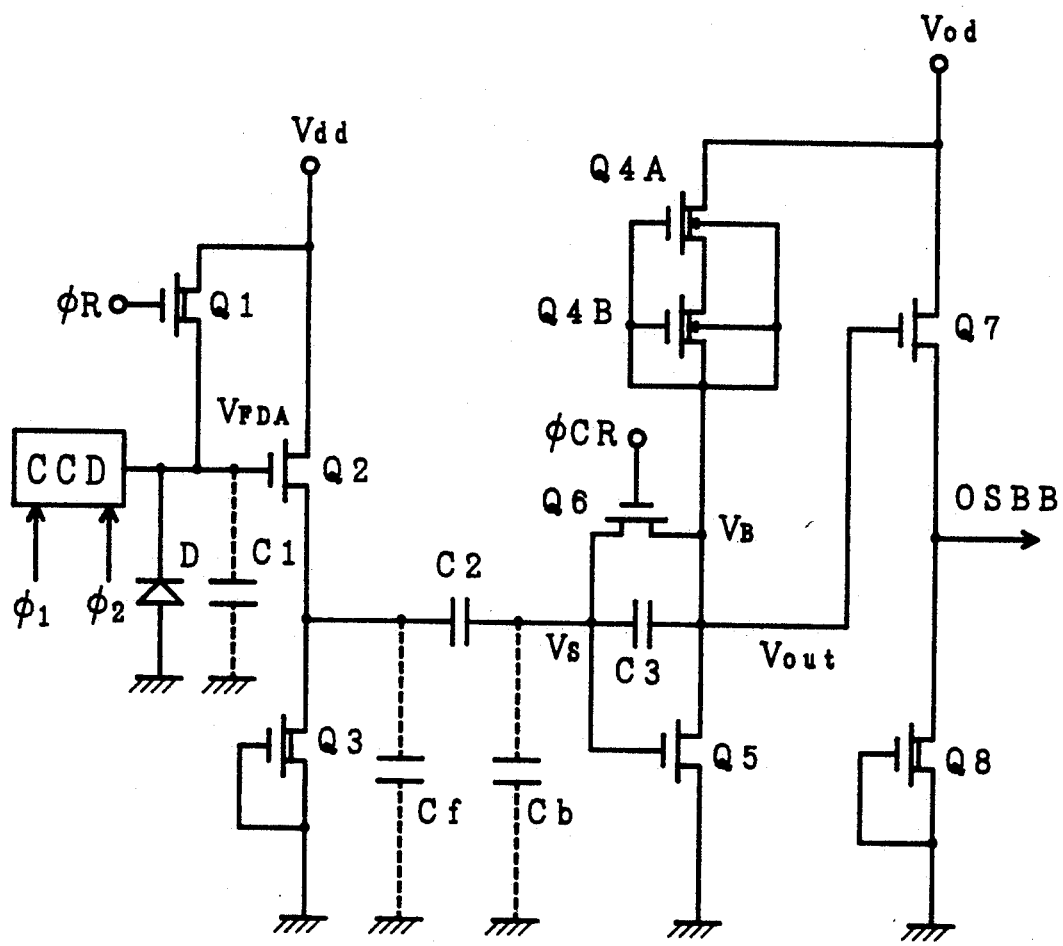
FIG. 1 is a circuit diagram showing one embodiment of an output detecting circuit, to which an amplification circuit according to the present invention is applied.

FIG. 1 shows one embodiment of the output detector.

In the same Figure, the signal charge which is transferred by the transfer pulses $\phi 1$ and $\phi 2$ through the CCD transfer circuit is inputted to the output diffusion layer which is expressed equivalently in the form of the diode D. The inputted signal charge is converted to a voltage signal by the capacitor C1 consisting of the P-N junction capacity of this output diffusion layer and the parasitic capacity in the reset MOSFET Q1 and the amplification MOSFET Q2. The voltage signal of this capacitor C1 is power-amplified by the source-follower circuit consisting of the amplification MOSFET Q2 and the load MOSFET Q3. This load MOSFET Q3 consists of a depletion type MOSFET and functions as a constant current load because its gate and source are used in common.

In this embodiment, the voltage signal which is power-amplified by the source-follower circuit is transmitted to the gate of a source-earth type amplification MOSFET Q5 in order to effect a voltage amplification of the signal. In this case, a capacitor C2 as a coupling capacity is disposed between the output of the source-follower circuit and the gate of the source-earth type amplification MOSFET Q5 in order to set the operation point of the source-earth type amplification MOSFET Q5 to an optimum point irrespective of the D.C. voltage contained in the voltage signal of the source-follower circuit. A bias voltage VB is intermittently applied to the gate of the amplification MOSFET Q5 through a switch MOSFET Q6. In other words, a timing pulse $\phi CR$ is supplied to the gate of this switch MOSFET Q6, and this MOSFET Q6 is turned ON in substantial synchronism with the timing at which the output diffusion layer (capacitor C1) is reset as will be later described, or in other words, during the period other than the output period of the signal charge.

Although not particularly limitative, the source-earth amplification MOSFET Q5 is equipped at its drain with a depletion type MOSFET Q4 which has its gate and source connected to act as a constant current source so as to raise the open gain of the inversion amplification circuit. Here, this depletion type MOSFET Q4 consists of two MOSFETs Q4A and Q4B, as will be later described in more detail, which are connected in the so-called "cascode" to have the same potential as the substrate potential at the connected portion connected with the drain of the aforementioned amplification MOSFET Q5.

The inversion amplification circuit consisting of the aforementioned amplification MOSFETs Q5 and Q4 is made to have a high open gain. By this inversion amplification circuit, a voltage signal VS which is fed to the gate of the amplification MOSFET Q5 is voltage-amplified and outputted as an output signal Vout. Moreover, a gain setting capacitor C3 is disposed between the input and output of the inversion amplification circuit, in other words, between the gate and drain of the amplification MOSFET Q5. Specifically, the inversion amplification is given a gain corresponding to the ratio of C2/C3 by having the capacitor C2 as an input capacitor and the capacitor C3 as a feedback capacitor.

The reason why the output of the source-follower circuit and the input of the inversion amplification circuit using the source-earth type amplification MOSFET Q5 are separated D.C.-wise through the capacitor C2 is as follows. If the output of the source-follower output circuit is directly connected to the input of the inversion amplification circuit, the operation point of this inversion amplification circuit comes of harmony. In order to extract the signal charge efficiently while maintaining the CCD performance, the output diffusion layer (N layer) must be reset to the high voltage Vdd of about 10 V or higher. Therefore, the output voltage of the source-follower circuit drops with a voltage, whose level is lower by the threshold voltage of the source-follower amplification MOSFET Q2 than the voltage Vdd, as a reference. Therefore, it may be possible to reduce the voltage level inputted to the inversion amplification circuit by increasing the threshold voltage of the source-follower amplification MOSFET Q2. If this circuit arrangement is used, however, the characteristics of the source-follower amplification MOSFET Q2 will get deteriorated under the operation condition where the output voltage becomes about less than one half of the power supply voltage Vdd.

On the other hand, if the voltage gain of the output voltage Vout is set to 5 times in the inversion amplification circuit, for example, the output voltage becomes below 1/6 times the power supply voltage Vod. Quite naturally, the gate voltage VS of the source-earth type amplification MOSFET Q5 must be below the value described above. In this point, too, it is theoretically possible to increase the operation point to about one half of the power supply voltage Vod by extremely increasing the threshold voltage of the source-earth type amplification MOSFET Q5, but such circuit arrangement is not preferable from the aspect of the MOSFET characteristics. Needless to say, the source-follower amplification MOSFET Q2 or the like is fabricated as finely as possible so as to obtain a higher sensitivity, and its output voltage is likely to fluctuate remarkably with its fabrication variance. It is by no means a rare case that the output voltage fluctuates by 1 V or more from device to device. In contrast, since the voltage gain of the inversion amplification circuit is great, the dynamic range of its input is so narrow that it is difficult to offset the variance described above.

Furthermore, if the source-follower circuit and the inversion amplification circuit are directly connected to each other as described above, a feed-through component (or the drop of the voltage signal in the capacitor Cl) available when the reset MOSFET Q1 is turned OFF by changing the reset pulse $\phi R$ from the high level to the low level is amplified, too, by the inversion amplification circuit, so that the voltage range that can be used for the signal component is narrowed. The amplification circuit also amplifies as such the thermal noise.

Accordingly, there are so many problems that this circuit structure cannot be put into practical application.

Accordingly, this embodiment separates D.C.-wise the output of the source-follower circuit from the input of the inversion amplification circuit using the source-earth type amplification MOSFET Q5 through the capacitor C2 as described above, and lets these two amplification circuits operate under their optimum conditions, respectively. In other words, the output diffusion layer (N layer) is reset to the high voltage Vdd above about 10 V, and a relatively high level voltage signal corresponding to this voltage is outputted on the source-follower circuit side in order to extract the signal charge efficiently while keeping the CCD performance. In contrast, the switch MOSFET Q6 is disposed on the inversion amplification circuit side so as to supply the bias voltage VB to the gate of the source-earth amplification MOSFET Q5 under the optimum operation condition.

Furthermore, since the depletion type MOSFET Q4 (which has its MOSFETs Q4A and Q4B connected in the so-called "cascode" in the embodiment described above) disposed at the drain of the aforementioned amplification MOSFET Q5 and acting as the load means is given the same potential at its source as the substrate potential, its drain conductance (gmd=PARTIAL DERIVATIVE ID/PARTIAL DERIVATIVE VDS) can be reduced to improve the constant current characteristics. Thus, it is possible to increase the open gate of the amplification MOSFET and the feedback gain.

Incidentally, as shown in FIG. 1, an amplification circuit consisting of an amplification MOSFET Q7 and a load MOSFET Q8 is disposed at the post stage of the aforementioned MOSFET Q5.

Figure 2:
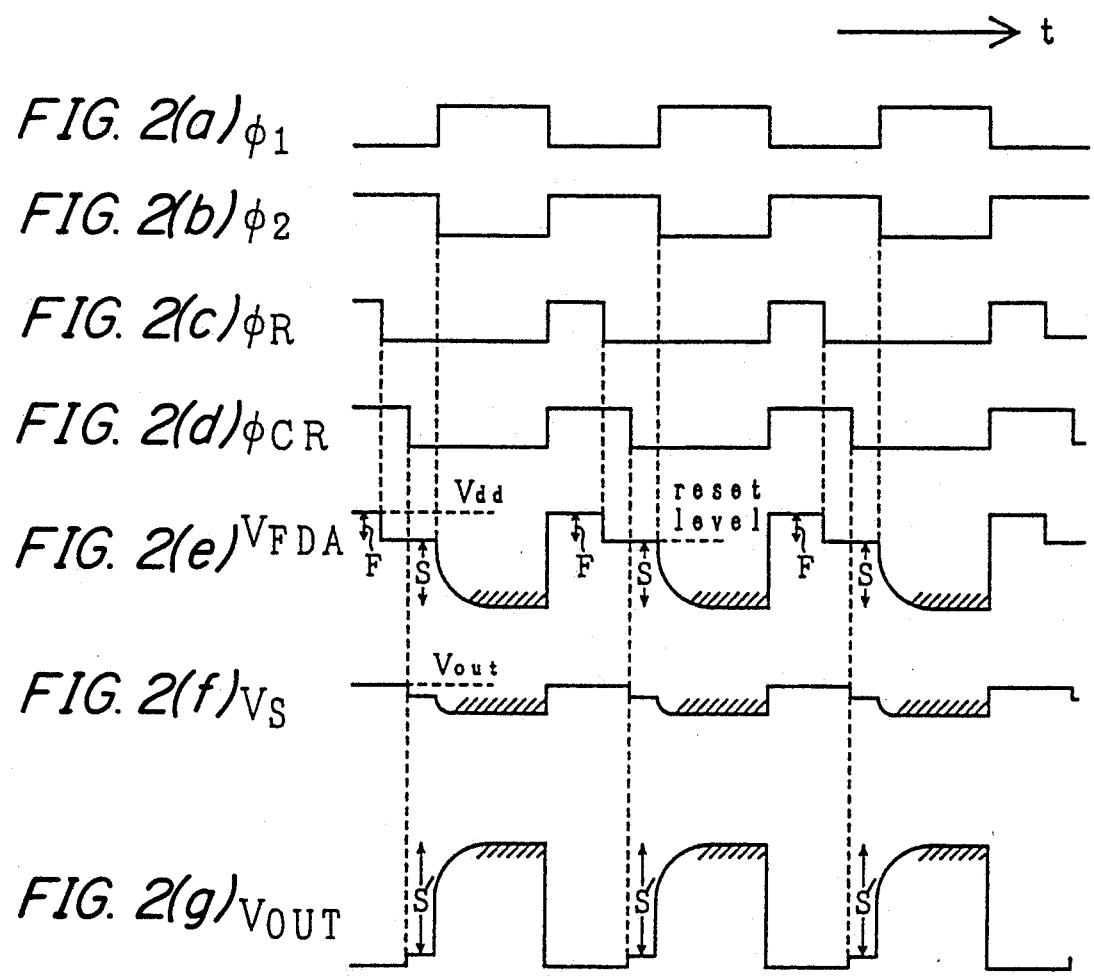
FIGS. 2(a)-2(g) are diagrams for explaining the operation of the circuit shown in FIG. 1.

The operation of the amplification circuit of this embodiment will be described with reference to the waveform diagram shown in FIG. 2.

When the transfer pulse $\phi 1$ is at the low level whereas the transfer pulse $\phi 2$ is at the high level, the signal charge is not outputted from the CCD to the output diffusion layer (capacitor Cl). At this time, both of the reset pulse $\phi R$ and the timing pulse $\phi CR$ are set to the high level. The reset MOSFET Q1 is turned ON in response to the high level of the reset pulse $\phi R$ and feeds the reset voltage Vdd to the output diffusion layer (capacitor Cl). The switch MOSFET Q6 is turned ON in response to the high level of the timing pulse $\phi CR$ and feeds the bias voltage VB to the gate of the amplification MOSFET Q5 of the inversion amplification circuit. Under this state, the source-follower circuit outputs the voltage corresponding to the reset voltage Vdd, but the input of the inversion amplification circuit is fixed to the bias voltage VB described above, as represented by VS. Accordingly, a D.C. voltage corresponding to the difference voltage between the two D.C. voltages applied across the capacitor C2 is accumulated in this capacitor C2.

When the reset pulse $\phi R$ changes from the high level to the low level, the switch MOSFET Q1 changes from the ON state to the OFF state, and the output diffusion layer (capacitor Cl) keeps the reset voltage VR under the floating state. At this time, the reset level drops to a certain extent due to the feed-through component (F) at the time of the change of the reset MOSFET Q1 from the ON state to the OFF state. At this timing, however, the timing pulse $\phi CR$ keeps the high level state and keeps the switch MOSFET Q6 ON. Accordingly, the inversion amplification circuit is enabled not to substantially accept the feed-through component occurring at the time of the change of the reset MOSFET Q1 from the ON state to the OFF state. Next, the timing pulse $\phi CR$ changes to the low level, and the switch MOSFET Q6 is turned OFF. At this time, a feed-through similarity occurs in this case as described above, but the impedance of the gate node of the source-earth type amplification MOSFET Q5 is determined by the capacitor C2 and by the load MOSFET Q3 and becomes hundred times smaller than that in the case of the output diffusion layer, so that the potential change due to the feed-through becomes smaller in proportion to the feed-through described above and can be neglected from the aspect of practical application.

Accordingly, during the period in which the transfer pulse $\phi 1$ is at the high level whereas the transfer pulse $\phi 2$ is at the low level, the voltage corresponding to the signal charge inputted from the CCD to the output diffusion layer is transmitted to the inversion amplification circuit through the source-follower circuit and the capacitor C2 and is outputted as the voltage signal output Vout. In this instance, the difference between the aforementioned output reset level and the bright output (S) corresponding to the signal charge is amplified by the inversion amplification circuit, and the circuit operation equivalent to that of the CDS circuit is thus exhibited. Specifically, the thermal noise generated in the source-follower circuit of this embodiment is eliminated, and the output is voltage-amplified by the inversion amplification circuit. In this way, it is possible to obtain a voltage signal Vout having a high S/N ratio and a high voltage amplitude. The amplification circuit of this embodiment provides the advantage that the influences of the waveform distortion up to the CDS circuit and waveform disturbance resulting from various jump-in pulses due to extension of wirings can be eliminated in comparison with the case where the difference between the output reset level and the bright output (S) is likewise obtained by the correlational double sampling (CDS) circuit disposed outside.

Even if any D.C.-like change of the voltage signal occurs due to the change of the threshold voltage resulting from the fabrication variance when the source-follower MOSFET Q2 is miniaturized in order to obtain a higher sensitivity of the source-follower circuit, the capacitor C2 offsets such change. Accordingly, the inversion amplification circuit is not affected by this change but can perform a stable voltage amplification operation at the optimum operation point which is set by the bias voltage VB. Moreover, the inversion amplification circuit has its gain set only by the capacity ratio of the aforementioned capacitor C2 and capacitor C3 so that it can generate the amplified output signal Vout having an excellent linearity.

Specifically, the gain Av of the inversion amplification circuit is obtained from the following equation (1):

$$Av = -AVo/[1 + (C3/C2)Avo] \tag{1}$$

Here, AVo is the open loop gain of the Inversion amplification circuit, which can be deformed into the following equation (2) because it is set as AVo IMAGE INF:

$$Av = -C3/C2 \tag{2}$$

Since the signal amplified by the inversion amplification circuit is determined only by the capacity ratio of the capacitors C2 and C3, as will be apparent from the equation (2), it is possible to obtain the output signal Vout having an excellent linearity with respect to the input voltage.

Figure 3:
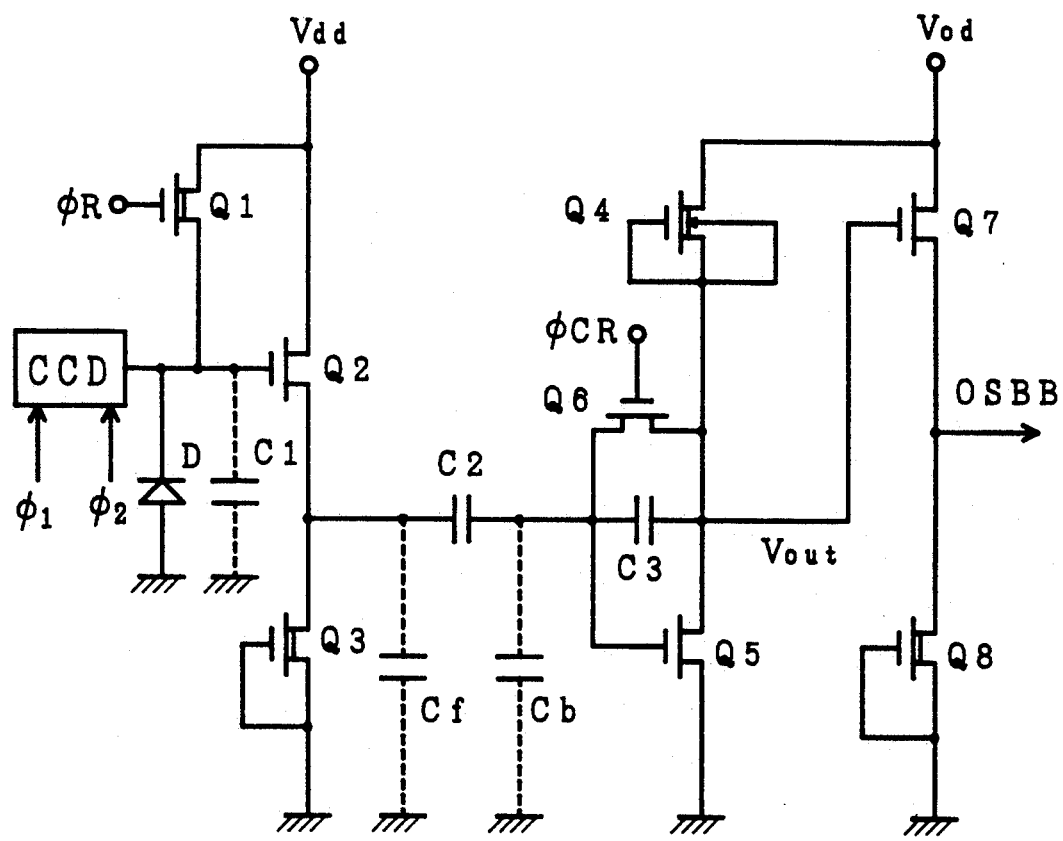
FIG. 3 is a circuit diagram showing another embodiment of the output detecting circuit, to which an amplification circuit according to the present invention is applied.

FIG. 3 is a circuit diagram showing another embodiment of the output detecting circuit.

The parts having the same numerals as those of FIG. 1 are identical to those of FIG. 1, and the structure different from FIG. 1 resides in the load means to be connected with the amplification MOSFET Q5. Specifically, this load means consists of one depletion type MOSFET Q4 which has its gate and source connected and its source given at the same potential as the substrate potential.

Figure 4:
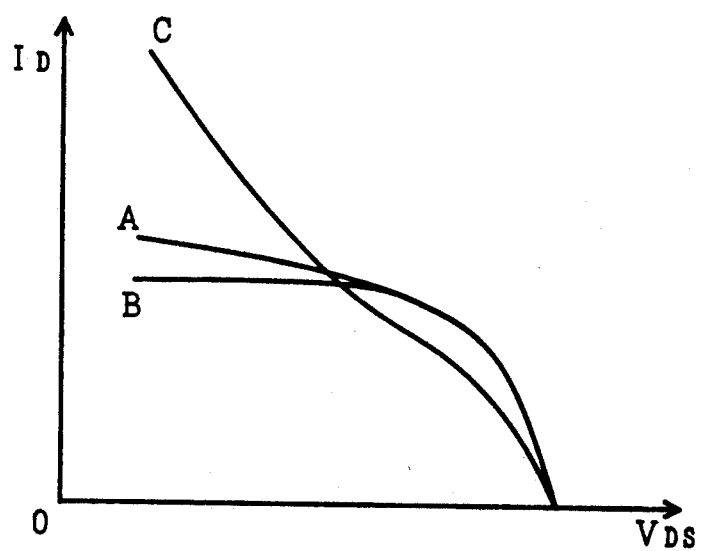
FIG. 4 is an explanatory diagram showing an effect of the present invention.

FIG. 4 plots the characteristics of the ID (drain current) against the VDS (source-drain voltage) in case of the structure thus made. A characteristic curve A plots the case of the MOSFET Q4 shown in FIG. 3, and a characteristic curve B plots the case of the MOSFETs Q4A and Q4B connected in the cascade, as shown in FIG. 1.

In the cascode connection structure of the plurality of MOSFETS, it will be apparent that the drain conductance (gmd=PARTIAL DERIVATIVE ID/PARTIAL DERIVATIVE VDS) can be reduced to improve the constant current characteristics if the structure has many MOSFETs.

Incidentally, a characteristic curve C appearing in the same Figure plots the case where the depletion type MOSFET acting as the load means fails to have the same potential at its source as that of the substrate (where the substrate potential is connected with the GND level of the circuit), and illustrates that the constant current characteristics are seriously bad.

In the embodiment described above, moreover, the switch MOSFET Q6 is connected between the input and output of the inversion amplification circuit, in other words, between the gate and drain of the source-earth amplification MOSFET Q5. In this way, the bias voltage VB can be set at an intersection of a straight line, on which the input voltage and the output voltage are equal, in the input/output transfer characteristics of the inversion amplification circuit by shorting the input and output of the inversion amplification circuit. Thus, the bias can always be set under the optimum condition for the process variance of the MOSFETs Q4 and Q5 without any special bias power source. Although not particularly limitative, the embodiment described above is equipped at its output portion with the source-follower circuit which consists of the source-follower amplification MOSFET Q7 and the load MOSFET Q8.

The circuit for determining the bias voltage VB by shorting the input and output of the inversion amplification circuit has the following advantages.

In the conventional FDA, when a high signal charge is outputted, the source-follower output voltage has a large voltage varying range to elongate the time period required for its restoration, in other words, for its resetting in case the output diffusion layer is to be reset by the reset pulse φR. This elongation involves the following problems. A signal reading frequency has to be raised with the increase in the pixel number of a solid imaging element. In accordance with the increase in the pixel number, moreover, a higher sensitivity is required so that the source-follower amplification MOSFET Q2 has to be worked to the smaller and smaller size. Accordingly, the current supply ability of the MOSFET Q2 is reduced so that its restoration takes a long time because the parasitic capacity at the source output is charged up by the difference from the current flowing through the load MOSFET Q3.

If, on the contrary, the capacitor C2 is provided as in this embodiment and if the timing pulse φCR is raised to the high level in synchronism with the reset pulse φR to turn the switch MOSFET Q6 ON, the input voltage VS of the inversion amplification circuit is abruptly boosted by a kind of amplification of the bias voltage source or the inversion amplification circuit. This voltage rise can act to promote the restoration of the source potential of the source-follower amplification MOSFET Q2 through the capacitor C2 thereby to shorten the reset restoration time of the circuit. As a result, it is possible to provide an amplification circuit which is suited for the multiple pixel and high speed of the CCD solid imaging element.

The output detecting circuit has been specifically described in connection with the embodiment thereof but should not be limited to the embodiment. For example, the source-follower circuit may be connected in the cascade of a plurality of stages. Likewise, the inversion amplification circuit may be connected in the cascade of a plurality of stages.

Element Structure of Output Detector

Figure 17:
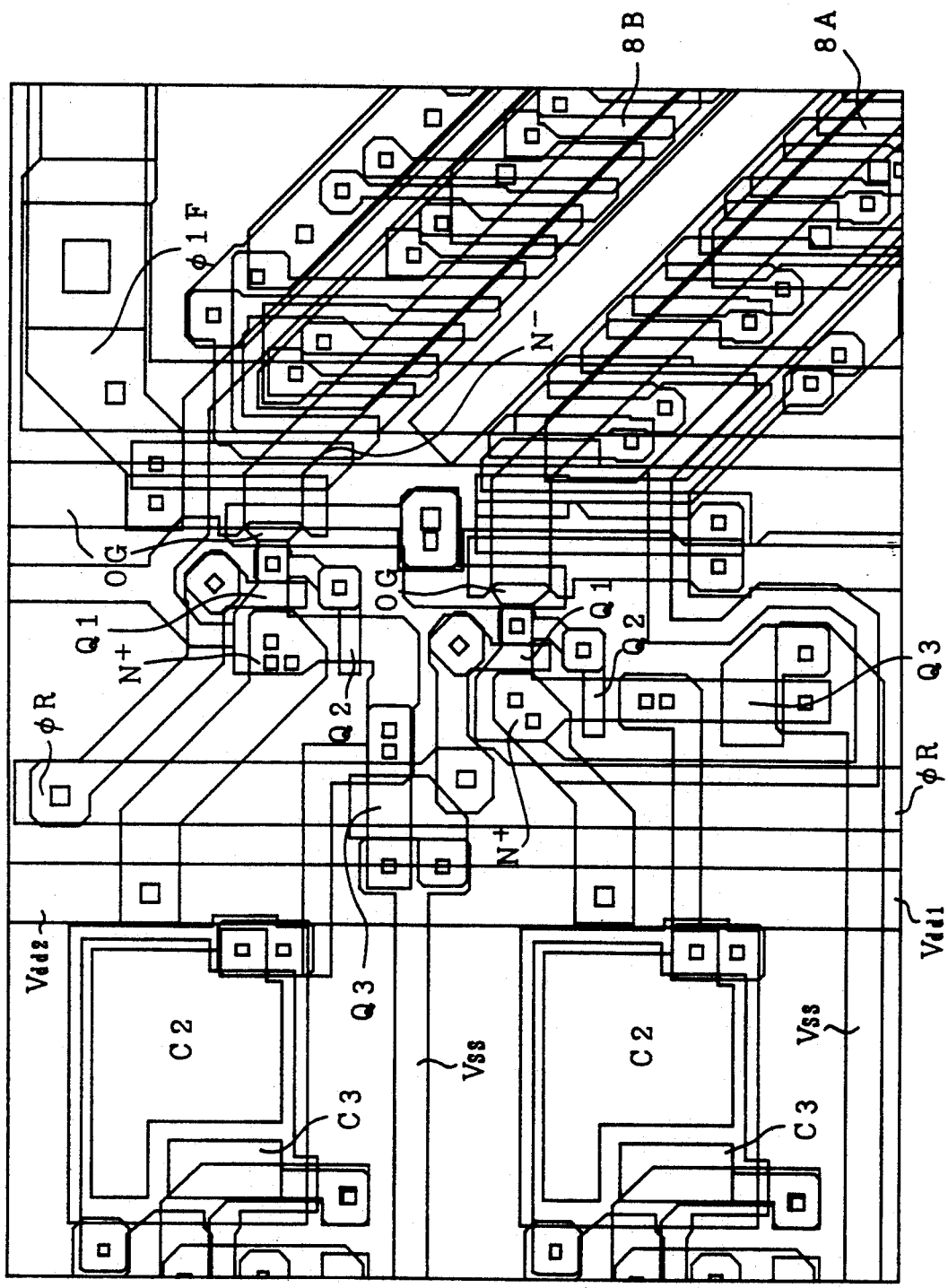
FIG. 17 is a top plan view showing one embodiment of an element structure of a portion of an output detector of a line sensor, to which the present invention is applied.

FIG. 17 is a top plan view showing a semiconductor substrate surface of the circuit of the output detector shown in FIG. 1 and centering the area which is formed with the MOSFETs Q1 to Q3 and the capacitor C3.

In the same Figure, the areas designated at 8A and 8B are an N-type diffusion layer containing the charge transfer passage of the CCD element. There are shown the output portion of the CCD element 8A for transferring the charge of the not-shown but juxtaposed photo diodes in even numbers and the output portion of the CCD element 8B for transferring the charge of the not-shown but juxtaposed photo diodes in odd numbers.

In this Figure, each CCD element has its gate electrodes shared for inputting a final stage clock φ1F. This is because the charges from the individual CCD elements are to be simultaneously outputted, as shown in FIG. 11.

Figure 18:
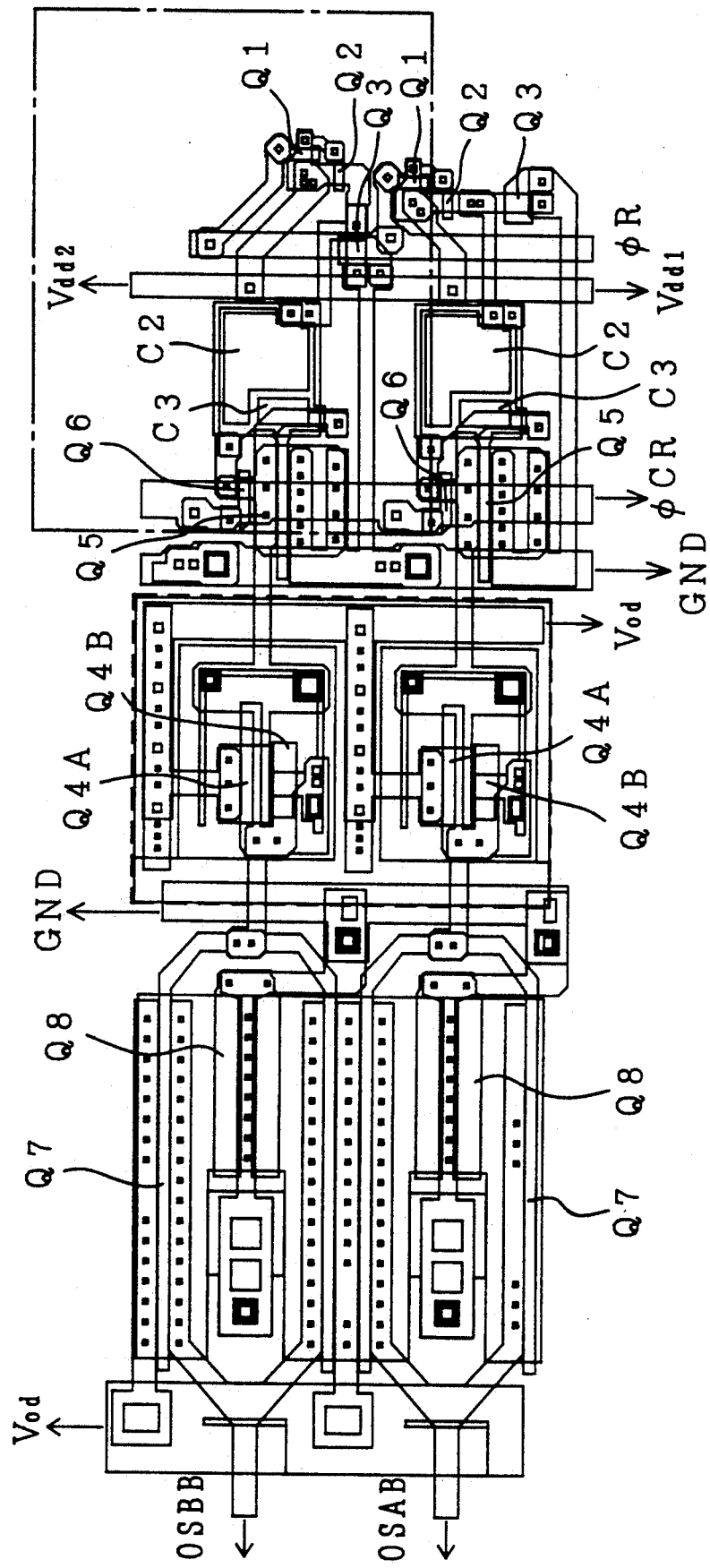
FIG. 18 is a top plan view showing one embodiment of an element structure of the whole portion of an output detector of a line sensor, to which the present invention is applied.

FIG. 18 is a top plan view showing the surface of the semiconductor substrate in which the entirety of the output detecting circuit containing the aforementioned MOSFETs Q1 to Q3 is packaged. The same Figure has upper and lower symmetric portions, each of which is packaged with the circuit shown in FIG. 1. The MOSFETs Q1 to Q8 of FIG. 1 are positioned and arranged at Q1 to Q8, respectively.

The capacitors C2 and C3 are also positioned and arranged at C2 and C3, respectively.

The cascode-connected MOSFETs Q4A and Q4B acting as the load means to be connected with the amplification MOSFET Q5 are arranged in blocks, as indicated by dotted lines.

Capacitor Structure

Figure 19:
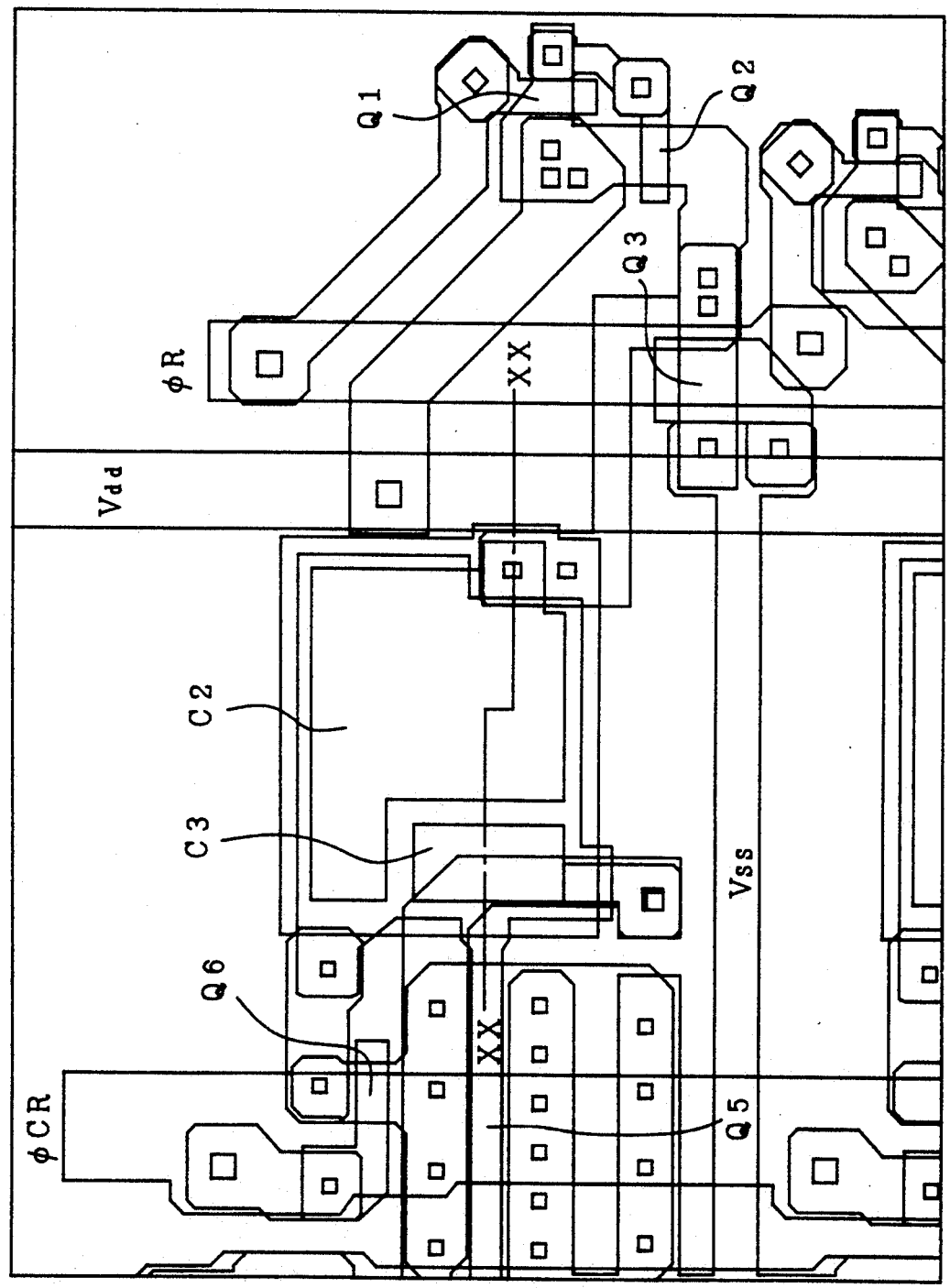
FIG. 19 is a top plan view showing a portion of FIG. 18 in an enlarged scale.
Figure 20:
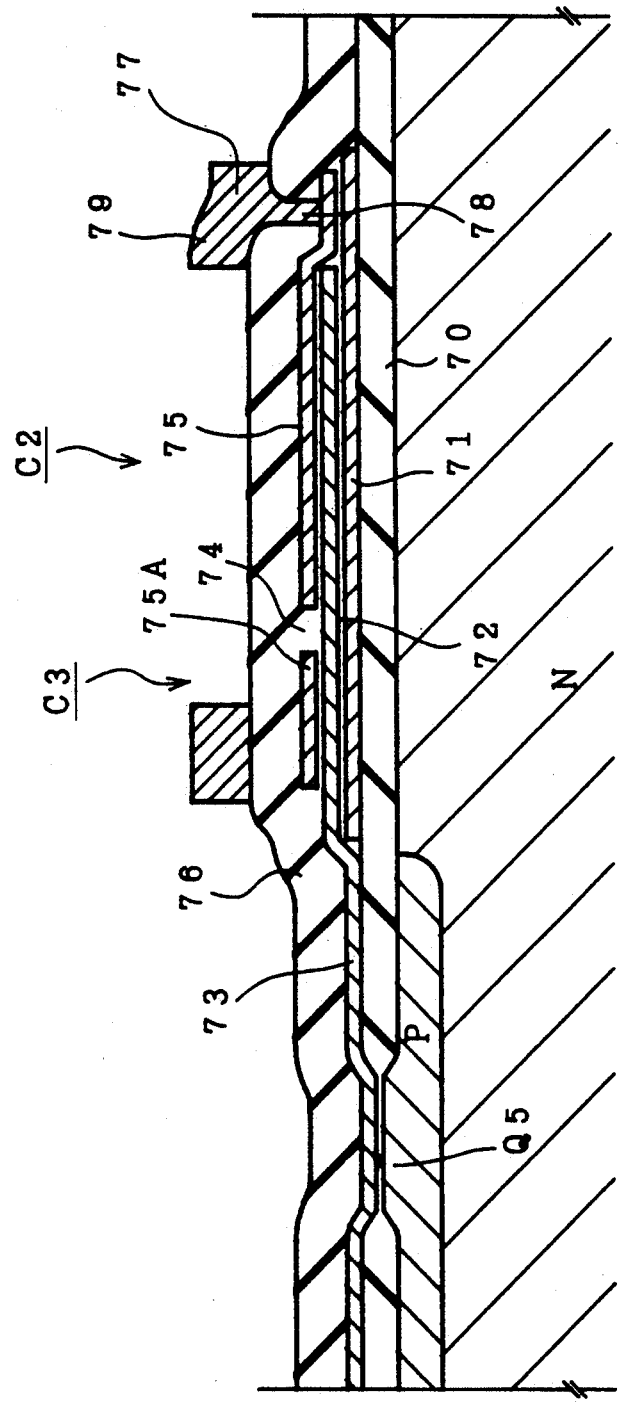
FIG. 20 is a section taken along line XX—XX of FIG. 19.

FIG. 20 is a section of the capacitor C2 shown in FIG. 14. This section is taken along line XX—XX of FIG. 19 showing the single-dotted block of FIG. 18 in an enlarged scale.

In FIG. 20, the insulating film 70 of the principal surface of the semiconductor substrate is formed thereover with a first-layered conductive layer 71. This first-layered conductive layer 71 is formed, for example, of the same material and at the same step as those of the first-layered charge transfer electrode FG of the aforementioned CCD element 8A. Next, a second-layered conductive layer 73 is formed through an insulating film 72. This second-layered conductive layer 73 is formed, for example, of the same material and at the same step as those of the second-layered charge transfer electrode SG of the aforementioned CCD element 8A. Through an insulating film 74, there is further formed a third-layered conductive layer 75. This third-layered conductive layer 75 is formed, for example, of the same material and at the same step as those of the third-layered charge transfer electrode TG of the aforementioned CCD element 8A. Furthermore, the area which is not formed with the aforementioned conductive layer 75 but overlapped with the aforementioned conductive layer 71 is formed with a conductive layer 75A which is formed at the same step as that of the conductive layer 75.

Through an insulating film 76, furthermore, there is formed an aluminum wiring layer 79 which is connected through a contact 78 with the aforementioned third-layered conductive layer 75 and through not-shown another contact with the aforementioned first-layered conductive layer 71.

In this connection, the conductive layers 71 and 75 connected with the aluminum wiring layer 79 and the conductive layer 73 constitute altogether the capacitor C2, and the conductive layer 73 is connected with the gate of the amplification MOSFET Q5. On the other hand, the aforementioned conductive layers 73 and 75A constitutes together the capacitor C3, and the conductive layer 75A is connected in a not-shown portion with the drain of the amplification MOSFET Q5.

There can be attained an effect that the area occupied by the capacitors C2 and C3 is reduced because the capacitor C3 is formed over the capacitor C2.

Moreover, the capacitor C2 thus constructed is additionally given a high anti-substrate capacity at its input side.

Specifically, the transmission characteristics A(OMEGA) is expressed by the equation (3) if the parasitic capacity at the input side is Cf and if the parasitic capacity at the output side is Cb.

$$|A(OMEGA)| = \frac{C}{[\{(OMEGA)R(CfCb + CCf + CCb)\}^2 + (Cb + C)^2]^{(\frac{1}{2})}} \quad (3)$$

If case of a small source-follower output resistance R (R RIGHT ALLOW 0), the influences of the parasitic capacity Cf are suppressed so that the aforementioned transmission characteristics A(OMEGA) is simplified into the equation (4).

$$|A(OMEGA)| = \frac{C}{Cb + C} = \frac{1}{(Cb/C) + 1} \quad (4)$$

If Cb RIGHT ALLOW 0, therefore, the absolute value of the transmission characteristics A(OMEGA) RIGHT ALLOW 1 (i.e., attenuation 0).

According to the capacitor C2 having the structure as described above, therefore, the signal attenuation can be avoided to constitute a high coupling capacity.

In order to reduce the size of the capacitor C2, the embodiment described above is given a multi-layered structure in which the first-layered conductive layer 71 and the third-layered conductive layer 75 are electrically connected and in which the second-layered conductive layer 73 and the aluminum wiring layer 79 are electrically connected. However, the multi-layered structure should not be limited thereto but may naturally be an ordinary two-layered structure.

Shielding Film as Earth

The semiconductor thus formed with the individual elements has its principal surface formed with a shielding film made of aluminum, for example, so as to protect the areas other than those formed with the light receiving portions 7, 9 and 11 against any incidence of light. Moreover, this shielding film is made of an electric conductor acting as the earth and is constructed in this embodiment, as shown in FIG. 21, such that a shielding film 90 over the area formed with the output detector and a shielding film 91 over the area other than that formed with the output detector are isolated from each other at the portions of the output diffusion layer of the individual CCD elements.

Furthermore, the shielding film 90 formed over the area having the output detector is connected with a terminal Vss4, whereas the shielding film 91 formed on the area other than that having the output detector is connected with a terminal Vss3.

And, the individual terminals Vss4 and Vss3 are electrically connected with each other outside of the semiconductor substrate so as to hold the aforementioned individual shielding films at the same potential earth.

Figure 21:
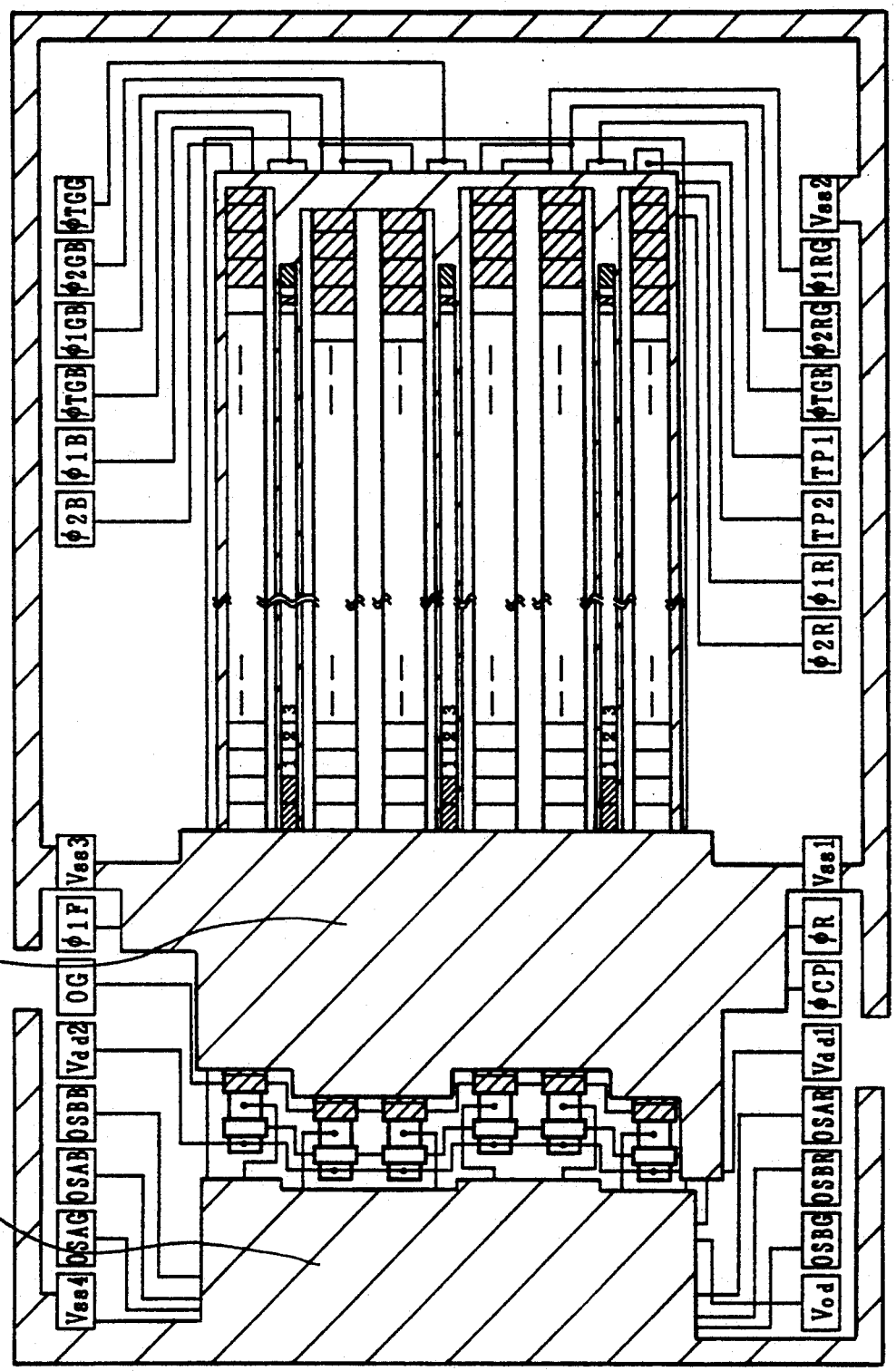
FIG. 21 is a top plan view showing one embodiment of an arrangement of a shielding film in a line sensor, to which the present invention is applied.
Figure 22:
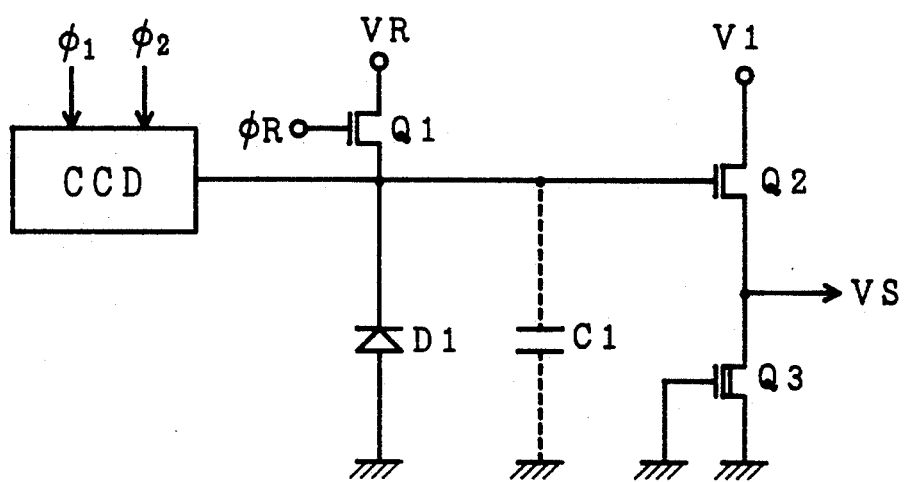
FIG. 22 is a circuit diagram showing one example of the amplification circuit of the prior art.

Incidentally, since the shielding film over the CCD elements is devised, as shown in FIG. 13, the shielding film herein termed to act as the earth is not formed in FIG. 21. In the structure shown in FIG. 21, however, the shielding film acting as the earth may naturally be formed over the CCD elements.

This structure is especially taken in the present embodiment so as to achieve the technical effects to be described in the following.

Even if the high-frequency component of the drive clock pulse to be applied to the charge transfer electrodes of the individual CCD elements should jump through the aforementioned shielding film 91 into the output of the output detector, this jump is prevented by the isolated portions of the shielding film 91.

Incidentally, these isolated individual shielding films 90 and 91 are electrically connected with each other outside of the semiconductor substrate so that they may be held at the same potential. Despite of this structure, however, it is precluded for the high-frequency component of the drive clock pulse to migrate around such connecting lines.

Thus, it is possible to prevent the noise due to the clock pulse for driving the CCD elements from affecting the output of the output detector.

The amplification circuit thus far described according to the present invention can be applied not only to the CCD solid imaging element constituting the line sensor or the area sensor but also to a fine light monitor element or sensor element which consists of a photo diode for generating a signal charge according to the amount of received light and an amplification circuit for amplifying the signal charge. In other words, the amplification circuit according to the present invention can be widely used in the circuits for amplifying a fine signal charge and outputting the amplified signal charge.

As has been apparent from the description thus far made, according to the amplification circuit of the present invention, a substantially high sensitivity can be realized with a simple structure, and a suitable application can be found in the CCD.

It is further understood by those in the art that the foregoing description is preferred embodiment of the disclosed device and that various changes and modifications may be made in the invention without departing from the spirit and scope thereof.

What is claimed is:

1. An amplification circuit comprising: a first capacitor for receiving a signal charge; a source-follower circuit for receiving a voltage of said first capacitor; an inversion amplification circuit including a source-earth type amplification MOSFET having a gate fed with an output signal of said source-follower circuit through a second capacitor; a feedback third capacitor connected between a gate and drain of said amplification MOSFET; and a switch element for feeding the gate of said amplification MOSFET with a predetermined bias voltage while the signal charge of said first capacitor is being reset, wherein said amplification MOSFET has its drain equipped as load means with a depletion type MOSFET having a gate and source connected, and wherein said depletion type MOSFET has its source given the same potential as the substrate potential thereof.

2. An amplification circuit according to claim 1, wherein said depletion type MOSFET acting as said load means is provided in plurality such that the plurality of depletion type MOSFETs are connected in cascode.

3. An amplification circuit according to claim 1 or 2, wherein said signal charge is inputted through a CCD.

* * * * *